US012068244B2

(12) United States Patent
Yoshimizu et al.

(10) Patent No.: US 12,068,244 B2
(45) Date of Patent: Aug. 20, 2024

(54) SEMICONDUCTOR DEVICE, TEMPLATE, AND METHOD OF MANUFACTURING TEMPLATE

(71) Applicant: Kioxia Corporation, Tokyo (JP)

(72) Inventors: Yasuhito Yoshimizu, Kawasaki Kanagawa (JP); Kaori Umezawa, Fujisawa Kanagawa (JP); Kosuke Takai, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 222 days.

(21) Appl. No.: 17/470,529

(22) Filed: Sep. 9, 2021

(65) Prior Publication Data

US 2022/0302024 A1 Sep. 22, 2022

(30) Foreign Application Priority Data

Mar. 18, 2021 (JP) .................. 2021-045058

(51) Int. Cl.
*H01L 23/522* (2006.01)
*H01L 21/033* (2006.01)
*H01L 23/00* (2006.01)
*H01L 29/423* (2006.01)
(Continued)

(52) U.S. Cl.
CPC ...... *H01L 23/5226* (2013.01); *H01L 21/0332* (2013.01); *H01L 24/08* (2013.01); *H01L 29/42376* (2013.01); *H10B 41/27* (2023.02); *H10B 43/27* (2023.02); *H01L 2224/08146* (2013.01)

(58) Field of Classification Search
CPC . H01L 23/5226; H01L 21/0332; H01L 24/08; H01L 29/42376; H01L 2224/08146; H10B 41/27; H10B 43/27
USPC ........................................................ 257/314
See application file for complete search history.

(56) References Cited

U.S. PATENT DOCUMENTS

| 7,952,136 B2 | 5/2011 | Kito et al. |
| 9,054,233 B2 | 6/2015 | Ohlsson et al. |
| 9,390,995 B2 | 7/2016 | Yamamoto et al. |

(Continued)

FOREIGN PATENT DOCUMENTS

| CN | 110349970 A | 10/2019 |
| JP | 5100080 B2 | 12/2012 |

(Continued)

*Primary Examiner* — Tu-Tu V Ho
(74) *Attorney, Agent, or Firm* — Finnegan, Henderson, Farabow, Garrett & Dunner, LLP

(57) ABSTRACT

A semiconductor device includes a substrate, a first stacked film and a second stacked film each including insulating layers and electrode layers alternately provided on the substrate, and columnar portions provided in the insulating layers and electrode layers of the first stacked film, and including charge storage layers and semiconductor layers. The second stacked film further includes an insulator including first and second lower faces, the first lower face is inclined by a first angle to an upper face of one of the electrode layers in the first stacked film, the second lower face is inclined by a second angle to the upper face of the one of the electrode layers in the first stacked film, and the second angle is less than the first angle. The insulating layers and electrode layers in the second stacked film are provided below the first and second lower faces of the insulator.

10 Claims, 30 Drawing Sheets

(51) Int. Cl.
*H10B 41/27* (2023.01)
*H10B 43/27* (2023.01)

(56) References Cited

U.S. PATENT DOCUMENTS

| | | | |
|---|---|---|---|
| 9,837,431 B2* | 12/2017 | Nishikawa | H10B 43/10 |
| 10,090,315 B2 | 10/2018 | Fukuzumi et al. | |
| 10,269,844 B2 | 4/2019 | Cheng et al. | |
| 10,707,231 B2 | 7/2020 | Park et al. | |
| 11,211,397 B2* | 12/2021 | Lu | H10B 43/35 |
| 2010/0019310 A1 | 1/2010 | Sakamoto | |
| 2019/0288183 A1 | 9/2019 | Kanaya | |
| 2021/0074643 A1 | 3/2021 | Watanabe et al. | |
| 2021/0118862 A1 | 4/2021 | Maejima et al. | |

FOREIGN PATENT DOCUMENTS

| | | |
|---|---|---|
| JP | 2021-44295 A | 3/2021 |
| TW | 201332066 A1 | 8/2013 |
| TW | 201511357 A | 3/2015 |
| TW | 201906189 A | 2/2019 |
| TW | 202025529 A | 7/2020 |

\* cited by examiner

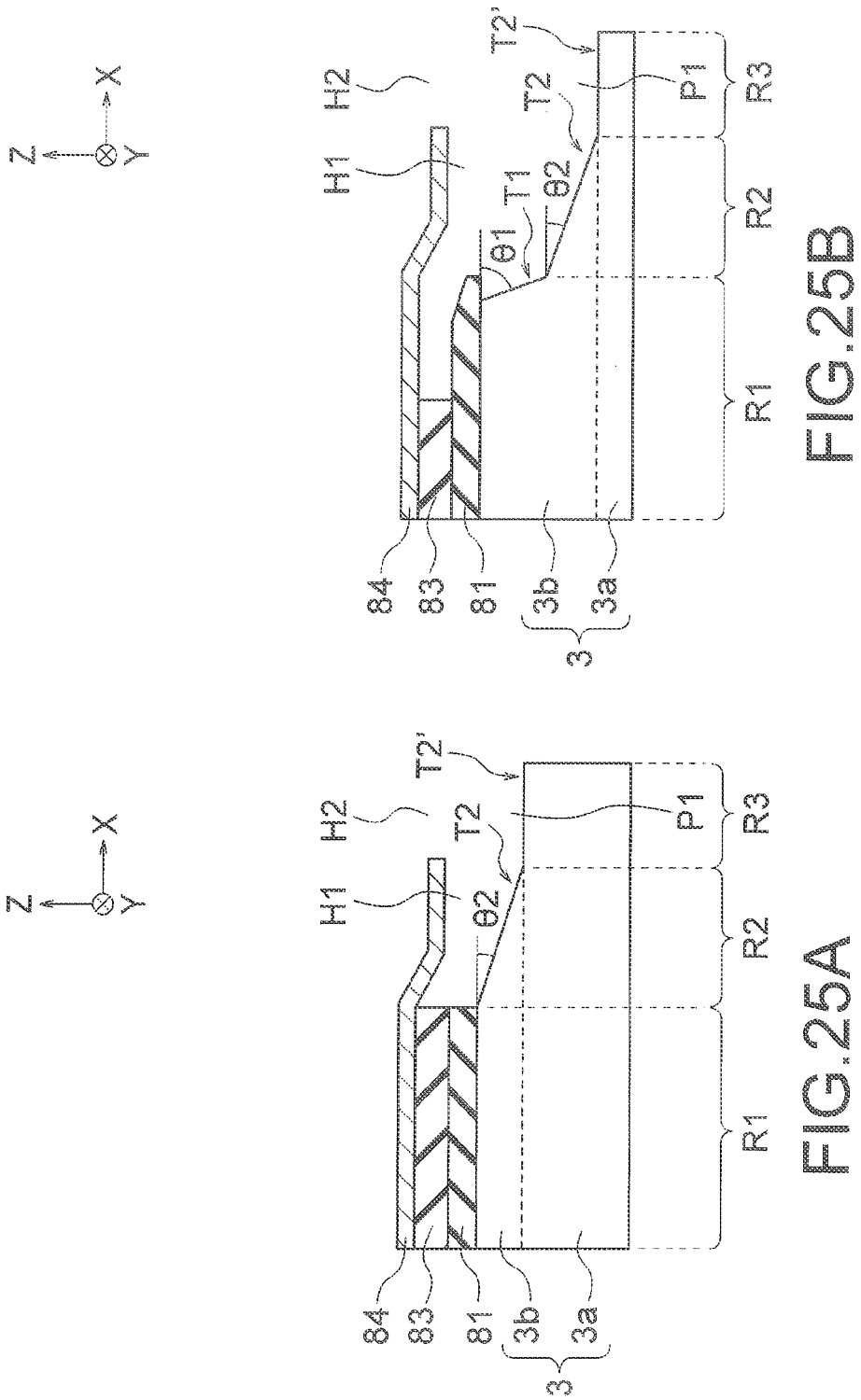

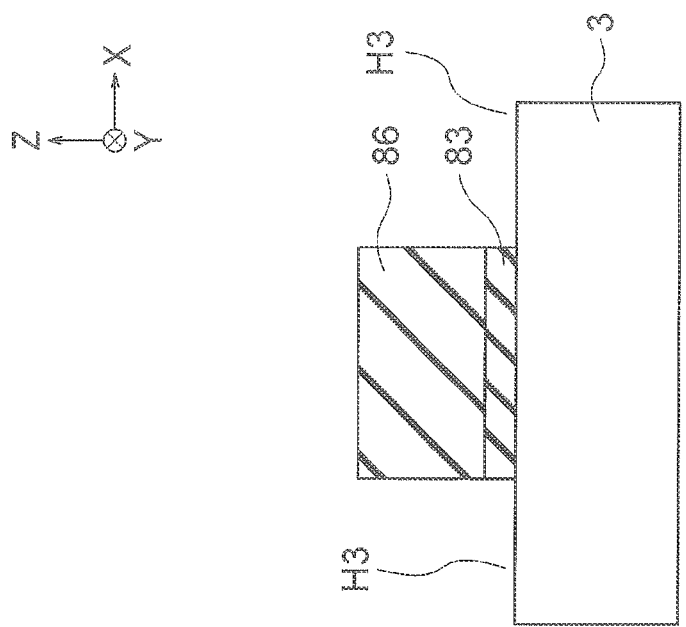
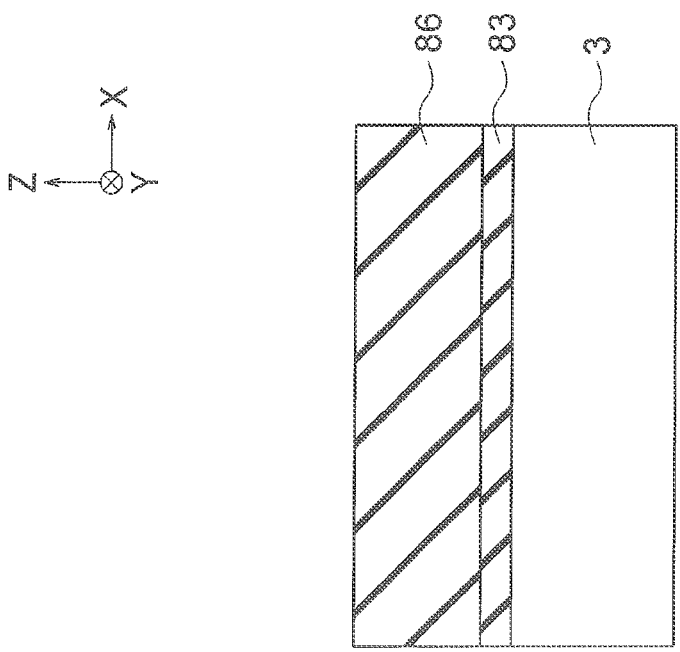

SEMICONDUCTOR DEVICE, TEMPLATE, AND METHOD OF MANUFACTURING TEMPLATE

CROSS REFERENCE TO RELATED APPLICATION

This application is based upon and claims the benefit of priority from the prior Japanese Patent Application No. 2021-045058, filed on Mar. 18, 2021, the entire contents of which are incorporated herein by reference.

FIELD

Embodiments described herein relate to a semiconductor device, a template, and a method of manufacturing the template.

BACKGROUND

In a semiconductor device, when a stacked film is provided to alternately include a plurality of insulating layers and a plurality of electrode layers, the insulating layers and the electrode layers are provided on an inclined face in some cases. In these cases, it is desirable to provide the insulating layers and the electrode layers on the inclined face having a suitable shape.

BRIEF DESCRIPTION OF THE DRAWINGS

FIGS. 23A to 25B are cross-sectional views illustrating a method of manufacturing the template 3 in FIG. 22;

FIGS. 27A to 29B are cross-sectional views illustrating a method of manufacturing the template 3 in FIG. 26.

DETAILED DESCRIPTION

Figure 1:
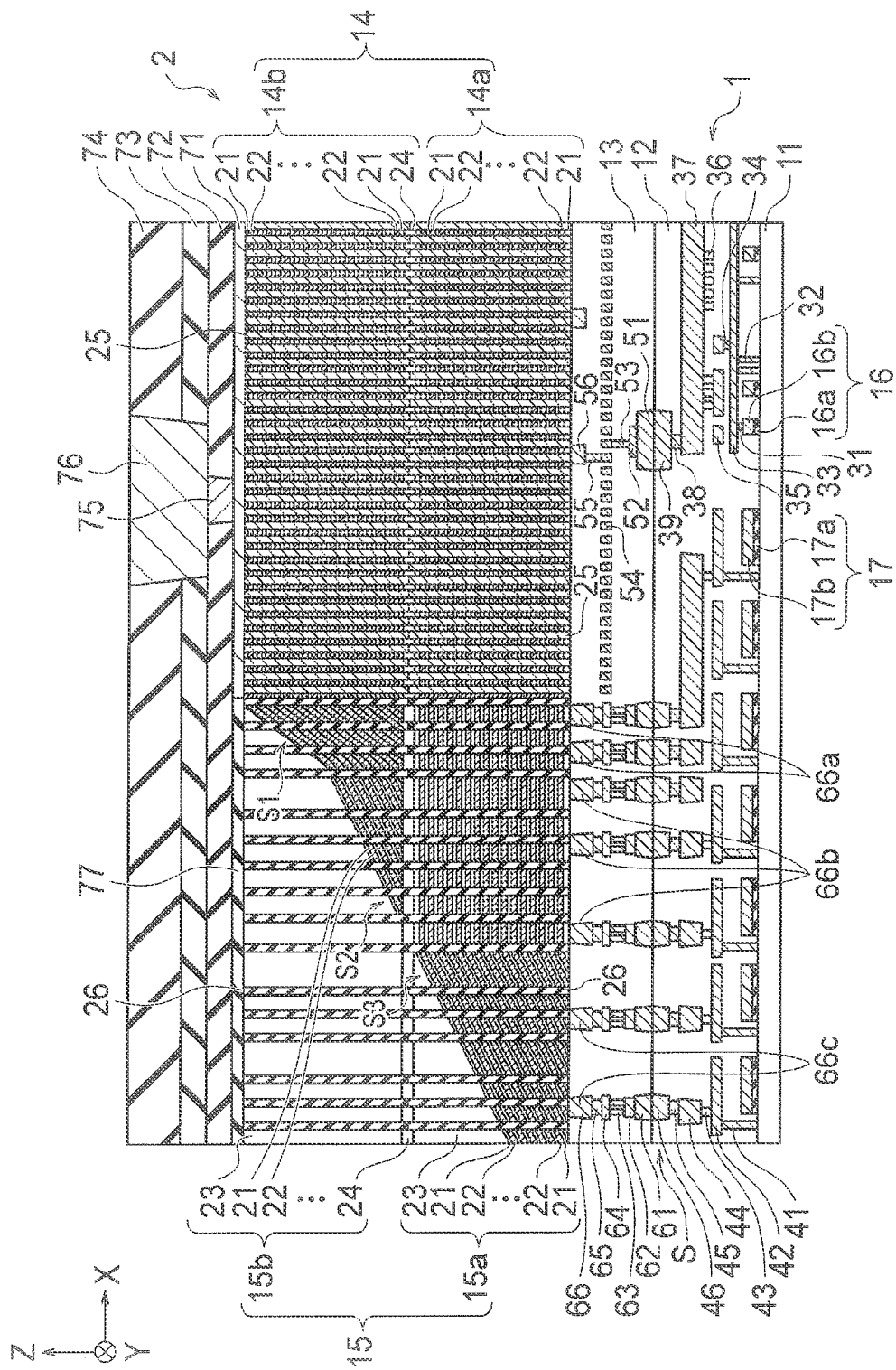
FIG. 1 is a cross-sectional view illustrating a structure of a semiconductor device of a first embodiment.

Embodiments will now be explained with reference to the accompanying drawings. In FIGS. 1 to 30, the same components are denoted by the same reference numerals, and repetitive descriptions are omitted.

A semiconductor device includes a substrate, a first stacked film including a plurality of insulating layers and a plurality of electrode layers alternately provided on the substrate, and a second stacked film including the plurality of insulating layers and the plurality of electrode layers alternately provided on the substrate. The device further includes a plurality of columnar portions provided in the insulating layers and the electrode layers of the first stacked film, and including charge storage layers and semiconductor layers. The second stacked film further includes an insulator including a first lower face and a second lower face, the first lower face being inclined by a first angle to an upper face of one of the electrode layers in the first stacked film, the second lower face being inclined by a second angle to the upper face of the one of the electrode layers in the first stacked film, the second angle being less than the first angle. The insulating layers and the electrode layers in the second stacked film are provided below the first and second lower faces of the insulator.

First Embodiment

FIG. 1 is a cross-sectional view illustrating a structure of a semiconductor device of a first embodiment.

The semiconductor device of the present embodiment is, for example, a three-dimensional semiconductor memory, and includes a circuit region 1 and an array region 2. In FIG. 1, the array region 2 is provided on the circuit region 1. The array region 2 includes a memory cell array, and the circuit region 1 includes a CMOS circuit controlling the memory cell array. The semiconductor device of the present embodiment is manufactured by, for example, bonding a circuit wafer including the circuit region 1 and an array wafer including the array region 2. FIG. 1 illustrates a bonded face S between the circuit region 1 (circuit wafer) and the array region 2 (array wafer).

In FIG. 1, an X direction, a Y direction, and a Z direction that are orthogonal to one another are illustrated. In the present specification, +Z direction is handled as an up direction, and −Z direction is handled as a down direction. The −Z direction may be coincident with a gravity direction, or may not be coincident with the gravity direction.

The semiconductor device of the present embodiment includes a substrate 11, an inter layer dielectric 12, an inter layer dielectric 13, a memory cell array portion 14, a hook-up portion 15, a plurality of transistors 16, a plurality of transistors 17, and the like. The substrate 11, the inter layer dielectric 12, the transistors 16, and the transistors 17 are provided in the circuit region 1. The inter layer dielectric 13, the memory cell array portion 14, and the hook-up portion 15 are provided in the array region 2.

The substrate 11 is, for example, a semiconductor substrate such as a silicon substrate. In FIG. 1, an upper face and a lower face of the substrate 11 are parallel to the X direction and the Y direction, and are perpendicular to the Z direction. The inter layer dielectric 12 is provided on the substrate 11, and the inter layer dielectric 13 is provided on the inter layer dielectric 12. An interface between the inter layer dielectric 12 and the inter layer dielectric 13 is a portion of the bonded face S. The memory cell array portion 14 and the hook-up portion 15 are provided on the inter layer dielectric 13. The transistors 16 and the transistors 17 are provided in the inter layer dielectric 12 on the substrate 11.

The memory cell array portion 14 includes a stacked film 14a and a stacked film 14b provided on the stacked film 14a. The memory cell array portion 14 (stacked films 14a and 14b) is an example of a first stacked film. Likewise, the hook-up portion 15 includes a stacked film 15a and a stacked film 15b provided on the stacked film 15a. The hook-up portion 15 (stacked films 15a and 15b) is an example of a second stacked film. Further, the stacked film 15a is an example of a first portion, and the stacked film 15b is an example of a second portion.

The stacked film 14a includes a plurality of insulating layers 21 and a plurality of electrode layers 22 alternately stacked on the inter layer dielectric 13. The stacked film 15a includes the plurality of insulating layers 21 and the plurality of electrode layers 22 alternately stacked on the inter layer dielectric 13, and an insulator 23 provided on the insulating layers 21 and the electrode layers 22. The stacked film 14a and the stacked film 15a share the same insulating layers 21 and the same electrode layers 22 with each other. The insulating layers 21, the electrode layers 22, and the insulator 23 in the stacked films 14a and 15a are respectively, for example, silicon oxide films, metal layers each including a tungsten layer, and a silicon oxide film. Each of the electrode layers 22 includes, for example, a word line and a source-side selection line.

The stacked film 14b includes an insulator 24 provided on the stacked film 14a, and a plurality of insulating layers 21 and a plurality of electrode layers 22 alternately stacked on the insulator 24. The stacked film 15b includes the insulator 24 provided on the stacked film 15a, the plurality of insulating layers 21 and the plurality of electrode layers 22 alternately stacked on the insulator 24, and an insulator 23 provided on the insulator 24, the insulating layers 21, and the electrode layers 22. The stacked film 14b and the stacked film 15b share the same insulator 24, the same insulating layers 21, and the same electrode layers 22 with each other. The insulating layers 21, the electrode layers 22, the insulator 23, and the insulator 24 in the stacked films 14b and 15b are respectively, for example, silicon oxide films, metal layers each including a tungsten layer, a silicon oxide film, and a silicon oxide film. Each of the electrode layers 22 includes, for example, a word line and a drain-side selection line.

The insulator 23 in the stacked film 15b has a face S1 inclined by a certain angle to the upper face of the substrate 11, and a face S2 inclined by another angle to the upper face of the substrate 11. The faces S1 and S2 form a lower face of the insulator 23. The upper face of the substrate 11 is parallel to an XY plane. Therefore, the faces S1 and S2 are inclined to the XY plane. The angle (e.g., 0.1 degrees to 4 degrees) of the face S2 to the upper face of the substrate 11 is set less than the angle (e.g., 4.5 degrees to 10 degrees) of the face S1 to the upper face of the substrate 11. Therefore, the face S1 is steeply inclined, whereas the face S2 is gently inclined. An upper end of the face S2 is in contact with a lower end of the face S1, and a contact (tangential line) between the lower end of the face S1 and the upper end of the face S2 is an inflection point (inflection line). In the present embodiment, upper faces and lower faces of the electrode layers 22 in the stacked films 14a and 14b are also parallel to the XY plane, and the faces S1 and S2 are inclined to the upper faces and the lower faces of the electrode layers 22 in the stacked films 14a and 14b.

Further, the insulator 23 in the stacked film 15a has a face S3 inclined by a certain angle to the upper face of the substrate 11. The face S3 forms the lower face of the insulator 23. Since the upper face of the substrate 11 is parallel to the XY plane, the face S3 is inclined to the XY plane. The angle of the face S3 to the upper face of the substrate 11 is set to be substantially equal to the angle of the face S2 to the upper face of the substrate 11. Therefore, the face S1 is steeply inclined, whereas the faces S2 and S3 are gently inclined. The face S3 illustrated in FIG. 1 is roughly positioned on an extended face of the face S2. In the present embodiment, the upper faces and the lower faces of the electrode layers 22 in the stacked films 14a and 14b are also parallel to the XY plane, and the face S3 is inclined to the upper faces and the lower faces of the electrode layers 22 in the stacked films 14a and 14b.

In the present embodiment, the insulating layers 21 and the electrode layers 22 in the hook-up portion 15 are provided below the faces S1, S2, and S3. Therefore, in the stacked film 15b, the insulating layers 21 and the electrode layers 22 below the faces S1 and S2 extend in non-parallel with the XY plane. Likewise, in the stacked film 15a, the insulating layers 21 and the electrode layers 22 below the face S3 extend in non-parallel with the XY plane. The face S1 is an example of a first lower face, and the faces S2 and S3 are each an example of a second lower face. Further, the angle of the face S1 to the upper face of the substrate 11 is an example of a first angle, and the angle of each of the faces S2 and S3 to the upper face of the substrate 11 is an example of a second angle.

In the memory cell array portion 14, a plurality of columnar portions 25 are provided in the insulating layers 21, the electrode layers 22, and the insulator 24 of the stacked films 14a and 14b, and penetrate through the stacked films 14a and 14b. Each of the columnar portions 25 of the present embodiment includes a charge storage layer and a channel semiconductor layer configuring a plurality of memory cells. Each of the columnar portions 25 of the present embodiment includes a portion provided in the stacked film 14a and a portion provided in the stacked film 14b.

In the hook-up portion 15, a plurality of beam portions 26 are provided in the insulating layers 21, the electrode layers 22, the insulator 23, and the insulator 24 of the stacked films 15a and 15b, and penetrate through the stacked films 15a and 15b. Each of the beam portions 26 is made of, for example, a silicon oxide film. Each of the beam portions 26 of the present embodiment functions as a beam reinforcing the stacked films 14a, 14b, 15a, and 15b. Each of the beam portions 26 of the present embodiment includes a portion provided in the stacked film 15a and a portion provided in the stacked film 15b.

Each of the transistors 16 includes a gate insulator 16a and a gate electrode 16b provided in order on the substrate 11, and a source region and a drain region (both not illustrated) provided in the substrate 11. The transistors 16 are disposed below the memory cell array portion 14, and are electrically connected to the columnar portions 25 in the memory cell array portion 14. Each of the transistors 16 is an example of a first transistor.

Each of the transistors 17 includes a gate insulator 17a and a gate electrode 17b provided in order on the substrate 11, and a source region and a drain region (both not illustrated) provided in the substrate 11. The transistors 17 are disposed below the memory cell array portion 14 and below the hook-up portion 15, and are electrically connected to the electrode layers 22 in the hook-up portion 15. Each of the transistors 17 is an example of a second transistor. In the present embodiment, a gate length of each of the transistors 17 is set longer than a gate length of each of the transistors 16.

Contact plugs 31, contact plugs 32, an interconnect layer 33, via plugs 34, an interconnect layer 35, via plugs 36, an interconnect layer 37, via plugs 38, and metal pads 39 are provided below the memory cell array portion 14 in the circuit region 1. The contact plugs 31 and 32 are provided on the gate electrodes 16b, the source regions, or the drain regions of the respective corresponding transistors 16. The interconnect layer 33, the via plugs 34, the interconnect layer 35, the via plugs 36, the interconnect layer 37, the via plugs 38, and the metal pads 39 are provided in order on the contact plugs 31 and 32.

Contact plugs 41, an interconnect layer 42, via plugs 43, an interconnect layer 44, via plugs 45, and metal pads 46 are provided below the memory cell array portion 14 and below the hook-up portion 15, in the circuit region 1. The contact plugs 41 are provided on the gate electrodes 17b, the source regions, or the drain regions of the respective corresponding transistors 17. The interconnect layer 42, the via plugs 43, the interconnect layer 44, the via plugs 45, and the metal pads 46 are provided in order on the contact plugs 41.

Metal pads 51, an interconnect layer 52, via plugs 53, an interconnect layer 54, via plugs 55, and an interconnect layer 56 are provided below the memory cell array portion 14 in the array region 2. The metal pads 51 are provided on the metal pads 39, and are joined with the metal pads 39. Joined faces between the metal pads 39 and the metal pads 51 are a portion of the bonded face S. The interconnect layer 52, the via plugs 53, the interconnect layer 54, the via plugs 55, and the interconnect layer 56 are provided in order on the metal pads 51. Each of the interconnects in the interconnect layer 54 functions as bit lines. Each of the interconnects in the interconnect layer 56 is in contact with the corresponding columnar portions 25, and is electrically connected to the corresponding columnar portions 25. In the above-described manner, the columnar portions 25 are electrically connected to the transistors 16 through an interconnect structure denoted by the reference numerals 31 to 39 and 51 to 56. Each of the interconnects in the interconnect layer 56 is an example of a first interconnect.

Metal pads 61, an interconnect layer 62, via plugs 63, an interconnect layer 64, via plugs 65, and an interconnect layer 66 are provided below the hook-up portion 15 in the array region 2. The metal pads 61 are provided on the metal pads 46, and are joined with the metal pads 46. Joined faces between the metal pads 46 and the respective metal pads 61 are a portion of the bonded face S. The interconnect layer 62, the via plugs 63, the interconnect layer 64, the via plugs 65, and the interconnect layer 66 are provided in order on the metal pads 61. Each of the interconnects in the interconnect layer 66 is in contact with the corresponding one of the electrode layers 22, and is electrically connected to the corresponding one of the electrode layers 22. In the above-described manner, the electrode layers 22 are electrically connected to the transistors 17 through an interconnect structure denoted by reference numerals 41 to 46 and 61 to 66. Each of the interconnects in the interconnect layer 66 is an example of a second interconnect.

FIG. 1 illustrates interconnects 66a, 66b, and 66c in the interconnect layer 66. The interconnects 66a are disposed below the face S1, and are electrically connected to the transistors 17 disposed below the memory cell array portion 14 as illustrated in FIG. 1. The interconnects 66b are disposed below the face S2, and are electrically connected to the transistors 17 disposed below the hook-up portion 15 as illustrated in FIG. 1. The interconnects 66c are disposed below the face S3, and are electrically connected to the transistors 17 disposed below the hook-up portion 15 as illustrated in FIG. 1.

Figure 4:
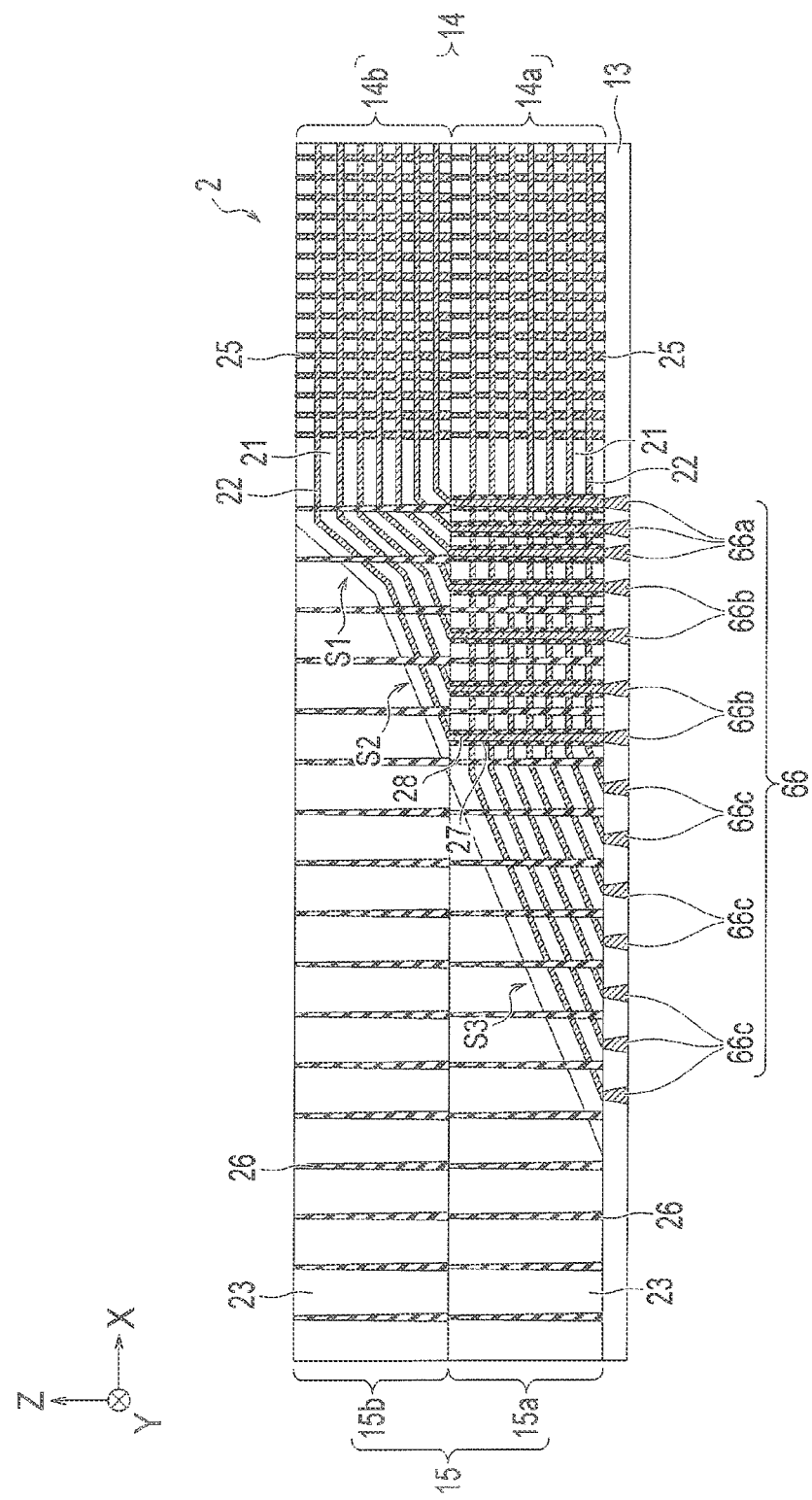
FIG. 4 is a cross-sectional view illustrating a structure of a memory cell array portion 14 and a hook-up portion 15 of the first embodiment.
Figure 5:
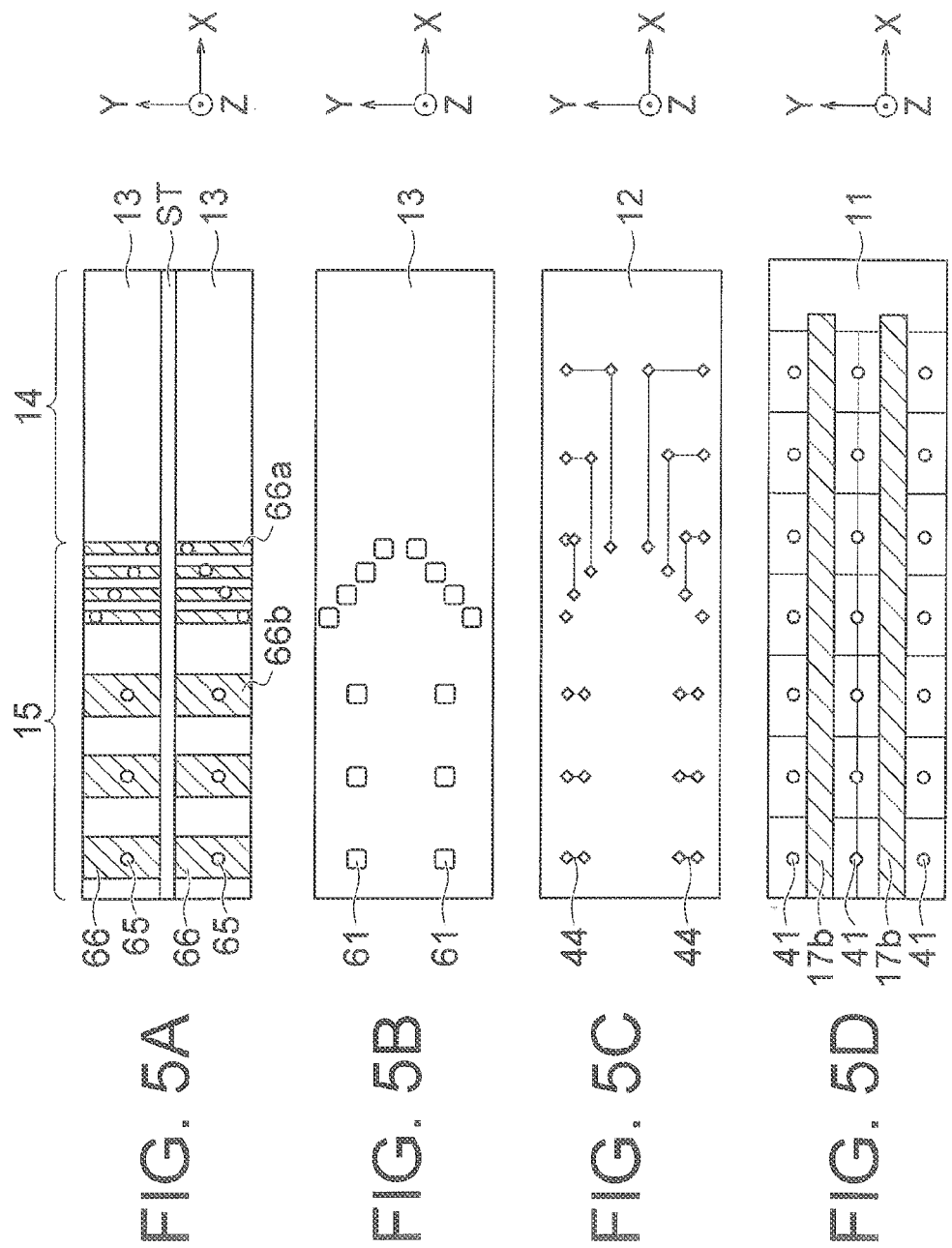
FIGS. 5A to 5D are plan views illustrating the structure of the semiconductor device of the first embodiment.

As described below, the interconnects 66a electrically connect the electrode layers 22 in the stacked film 15b and the transistors 17 below the memory cell array portion 14 (FIG. 4). The interconnects 66b electrically connect the electrode layers 22 in the stacked film 15b and the transistors 17 below the hook-up portion 15 (FIG. 4). The interconnects 66c electrically connect the electrode layers 22 in the stacked film 15a and the transistors 17 below the hook-up portion 15 (FIG. 4). Such a structure is described in more detail below.

The semiconductor device of the present embodiment further includes an interconnect layer 71, an insulator 72, an insulator 73, an insulator 74, via plugs 75, metal pads 76, and an insulator 77 in the array region 2. The interconnect layer 71 and the insulator 77 are respectively provided on the memory cell array portion 14 and the hook-up portion 15. The insulator 72, the insulator 73, and the insulator 74 are provided in order on the interconnect layer 71 and the insulator 77, and function as passivation insulators. The via plugs 75 are provided on the interconnect layer 71 in the insulator 72. The metal pads 76 are provided on the via plugs 75 in the insulators 73 and 74, and function as external connection pads (bonding pads) of the semiconductor device of the present embodiment. The metal pads 76 are electrically connected to the plurality of columnar portions 25 in the memory cell array portion 14 through the via plugs 75 and the interconnect layer 71.

Figure 2:
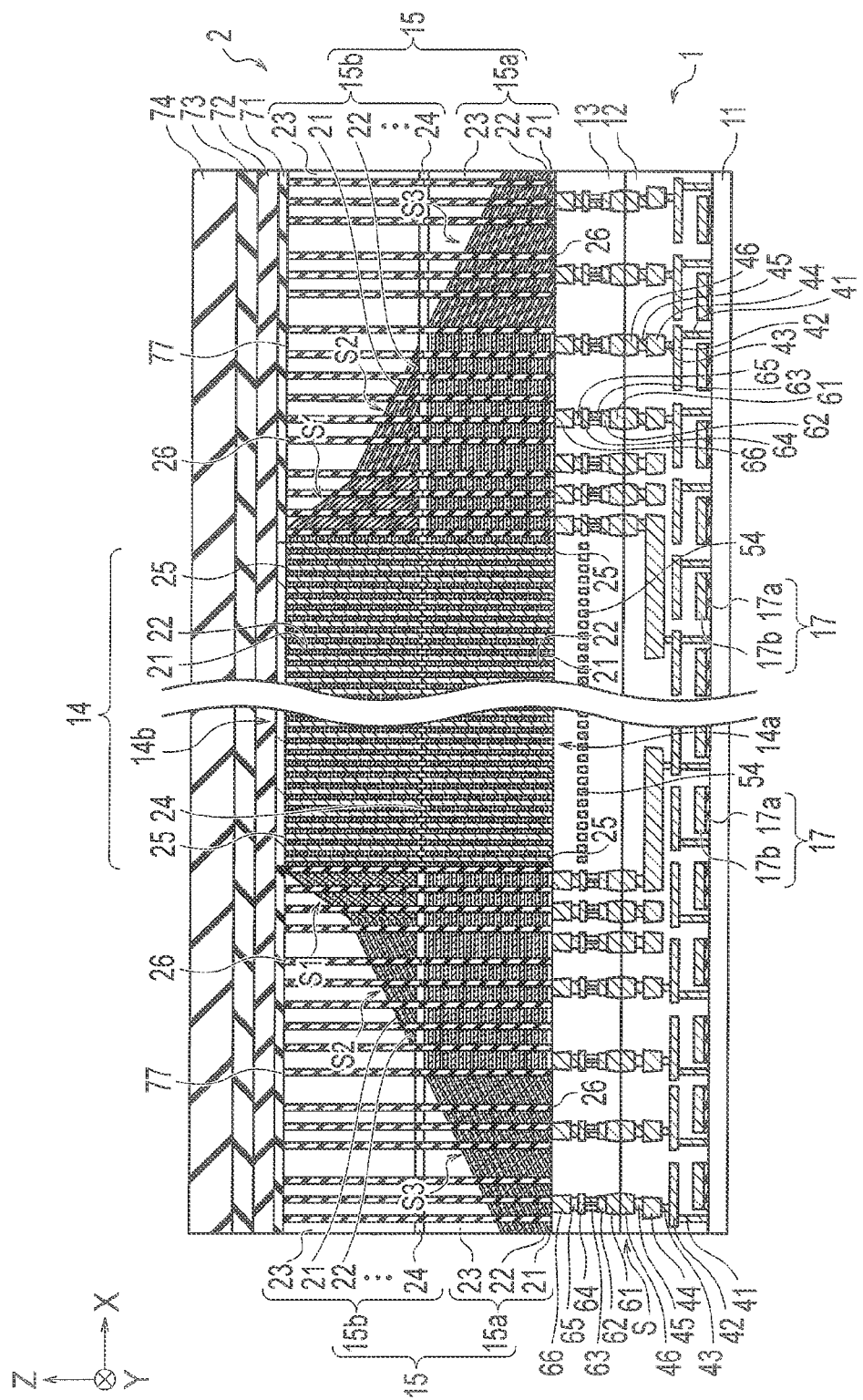
FIG. 2 is another cross-sectional view illustrating the structure of the semiconductor device of the first embodiment.

FIG. 2 is another cross-sectional view illustrating the structure of the semiconductor device of the first embodiment.

FIG. 2 illustrates a region substantially twice the region illustrated in FIG. 1. More specifically, FIG. 1 illustrates one memory cell array portion 14 and the hook-up portion 15 on one side of the memory cell array portion 14, whereas FIG. 2 illustrates one memory cell array portion 14 and the hook-up portions 15 on both sides of the memory cell array portion 14. The semiconductor device of the present embodiment includes one or a plurality of structures illustrated in FIG. 2.

Figure 3:
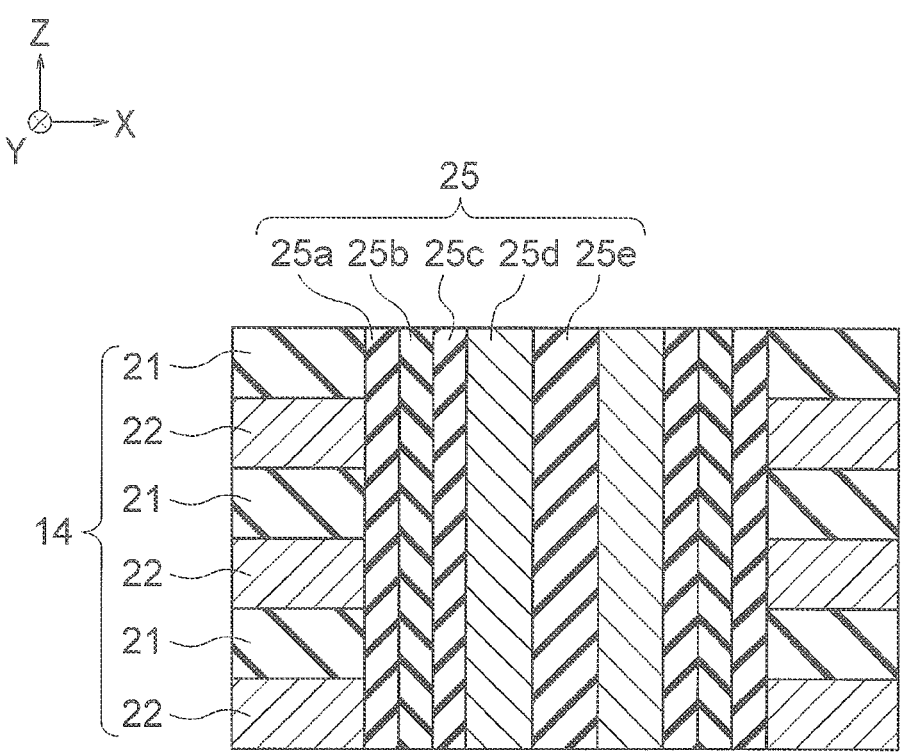
FIG. 3 is a cross-sectional view illustrating a structure of a columnar portion 25 of the first embodiment.

FIG. 3 is a cross-sectional view illustrating a structure of one of the columnar portions 25 of the first embodiment.

FIG. 3 illustrates the memory cell array portion 14 alternately including the plurality of insulating layers 21 and the plurality of electrode layers 22, and one columnar portion 25 provided in the memory cell array portion 14. As illustrated in FIG. 3, each of the columnar portions 25 of the present embodiment includes a block insulator 25a, a charge storage layer 25b, a tunnel insulator 25c, a channel semiconductor layer 25d, and a core insulator 25e that are provided in order in the memory cell array portion 14.

The block insulator 25a is, for example, a silicon oxide film. The charge storage layer 25b is, for example, an insulator such as a silicon nitride film. Alternatively, the charge storage layer 25b may be a semiconductor layer such as a polysilicon layer. The tunnel insulator 25c is, for example, a silicon oxide film or a silicon oxynitride film. The channel semiconductor layer 25d is, for example, a polysilicon layer. The core insulator 25e is, for example, a silicon oxide film.

FIG. 4 is a cross-sectional view illustrating a structure of the memory cell array portion 14 and the hook-up portion 15 of the first embodiment.

As with FIG. 1, FIG. 4 illustrates the memory cell array portion 14 and the hook-up portion 15 of the present embodiment. FIG. 4, however, illustrates the electrode layers 22 smaller in number than the electrode layers 22 in FIG. 1 in order to clearly describe relationship between the electrode layers 22 and the interconnects 66a to 66c.

As described above, the interconnect layer 66 includes the interconnects 66a disposed below the face S1, the interconnects 66b disposed below the face S2, and the interconnects 66c disposed below the face S3. The interconnects 66a are electrically connected to the transistors 17 below the memory cell array portion 14, the interconnects 66b are electrically connected to the transistors 17 below the hook-up portion 15, and the interconnects 66c are electrically connected to the transistors 17 below the hook-up portion 15 (FIG. 1).

The semiconductor device of the present embodiment includes a plurality of punch plugs 28 provided in the stacked film 15a of the hook-up portion 15 through insulators 27. The punch plugs 28 are disposed on the interconnects 66a and 66b below the faces S1 and S2. Each of the punch plugs 28 is an example of a plug in the above-described first portion.

The punch plugs 28 electrically connect the electrode layers 22 in the stacked film 15b and the interconnects 66a and 66b. More specifically, the punch plugs 28 below the face S1 electrically connect the electrode layers 22 and the interconnects 66a, thereby electrically connecting the electrode layers 22 and the transistors 17 below the memory cell array portion 14 (FIG. 1). The punch plugs 28 below the face S2 electrically connect the electrode layers 22 and the interconnects 66b, thereby electrically connecting the electrode layers 22 and the transistors 17 below the hook-up portion 15 (FIG. 1). In contrast, the electrode layers 22 in the stacked film 15a are in contact with the interconnects 66c, thereby being electrically connected to the transistors 17 below the hook-up portion 15 without through the punch plugs 28 (FIG. 1). The electrode layers 22 in the memory cell array portion 14 are electrically connected to the interconnects 66a to 66c through the electrode layers 22 in the hook-up portion 15.

In the following, the semiconductor device of the present embodiment is described in more detail with reference to FIG. 1 and FIG. 4.

The hook-up portion 15 of the present embodiment is provided in order to facilitate electric connection between the electrode layers 22 and the interconnects 66a to 66c. In the hook-up portion 15, the electrode layers 22 extend in non-parallel with the XY plane because the electrode layers 22 are provided below the faces S1 to S3 that are inclined faces. Accordingly, the electrode layers 22 are exposed on an upper face of the insulator 24 and an upper face of the inter layer dielectric 13, and the electrode layers 22 can be easily connected to the punch plugs 28 and the interconnects 66c on these upper faces. The electrode layers 22 electrically connected to the punch plugs 28 are electrically connected to the interconnects 66a and the interconnects 66b through the punch plugs 28.

To reduce a chip area of the semiconductor device of the present embodiment, it is desirable to make inclinations of the faces S1 to S3 in the hook-up portion 15 steep to reduce a planar shape of the hook-up portion 15. In contrast, when the number of electrode layers 22 in the memory cell array portion 14 and the hook-up portion 15 is increased, it is necessary to increase the number of transistors 17 for the electrode layers 22. Therefore, it may become difficult to secure a region for disposition of the transistors 17 on the substrate 11. The transistor 17 connected to a certain interconnect in the interconnect layer 66 is desirably disposed in or near a region just below the interconnect. This is because an electric path to connect the interconnect and the transistor 17 is reduced.

Therefore, in the hook-up portion 15 of the present embodiment, the inclination of the face S1 is made steep, whereas the inclinations of the faces S2 and S3 are made gentle. As a result, as compared with a case where the faces S1 to S3 each have the same inclination, it is possible to widely secure distances among the interconnects 66b and 66c below the faces S2 and S3. Accordingly, for example, even when the transistors 17 for the interconnects 66b and 66c are disposed just below the interconnects 66b and 66c, it is possible to sufficiently secure the region for disposition of the transistors 17. This makes it possible to reduce the electric paths connecting the interconnects 66b and 66c and the transistors 17.

In contrast, distances among the interconnects 66a below the face S1 of the present embodiment become narrow. Therefore, it is difficult to dispose the transistors 17 for the interconnects 66a just below the interconnects 66a. Therefore, the transistors 17 for the interconnects 66a of the present embodiment are disposed not below the hook-up portion 15 but below the memory cell array portion 14. This makes it possible to sufficiently secure the region for disposition of the transistors 17 for the interconnects 66a. Further, the interconnects 66a are disposed near the memory cell array portion 14. Therefore, even when the transistors 17 for the interconnects 66a are disposed below the memory cell array portion 14, it is possible to reduce the electric paths connecting the interconnects 66a and the transistors 17.

As described above, according to the present embodiment, the inclination of the face S1 is made steep and the inclinations of the faces S2 and S3 are made gentle, which makes it possible to suitably dispose the interconnects 66a to 66c and the transistors 17.

FIGS. 5A to 5D are plan views illustrating the structure of the semiconductor device of the first embodiment.

FIG. 5A illustrates layout of the interconnect layer 66 and the via plugs 65. In FIG. 5A, each of the interconnects in the interconnect layer 66 extend in the Y direction, the interconnects 66a near the memory cell array portion 14 have a small width, and the interconnects 66b far from the memory cell array portion 14 have a large width. FIG. 5A further illustrates a slit ST that is provided in the memory cell array portion 14 and the hook-up portion 15, and extends in the X direction.

FIGS. 5A to 5D each illustrate the same region in a planar view. Therefore, the metal pads 61 illustrated in FIG. 5B are disposed just below the respective via plugs 65 illustrated in FIG. 5A. FIG. 5C illustrates a plurality of interconnects in the interconnect layer 44 below the metal pads 61. In the interconnect layer 44 of FIG. 5C, the interconnects below the thick interconnects 66b in the interconnect layer 66 have a linear planar shape, and the interconnects below the thin interconnects 66a in the interconnect layer 66 have an L-shaped planar shape. The former interconnects in the interconnect layer 44 are electrically connected to the corresponding interconnects 66b, and the latter interconnects in the interconnect layer 44 are electrically connected to the corresponding interconnects 66a. FIG. 5D illustrates the gate electrodes 17b and the contact plugs 41. The gate electrodes 17b illustrated in FIG. 5D may be separated for each of the transistors 17, for individual control.

Figure 6:
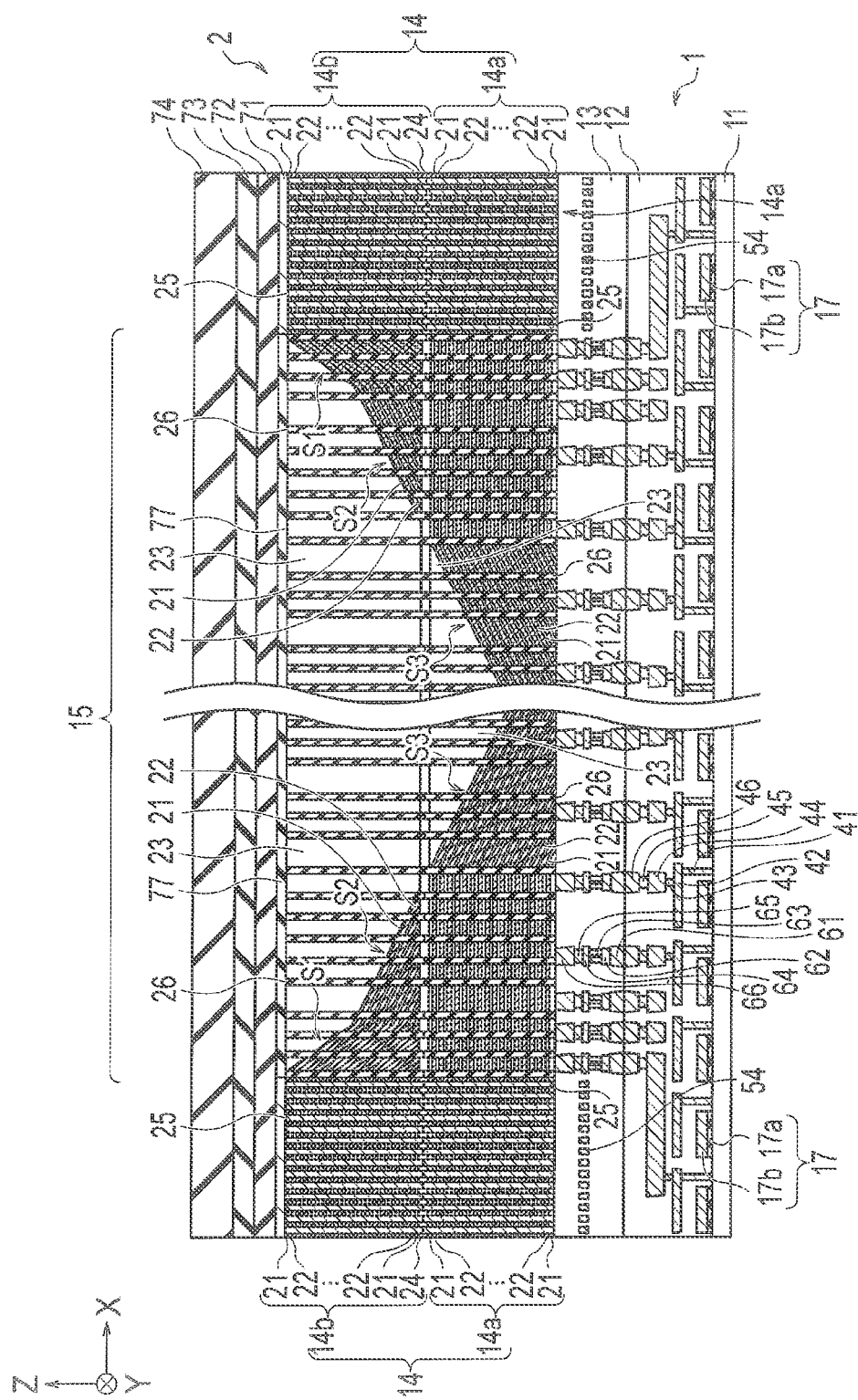
FIG. 6 is a cross-sectional view illustrating a structure of a semiconductor device of a modification of the first embodiment.

FIG. 6 is a cross-sectional view illustrating a structure of a semiconductor device of a modification of the first embodiment.

In FIG. 2, the memory cell array portion 14 is provided at a center, and the two hook-up portions 15 sandwich the memory cell array portion 14. In contrast, in FIG. 6, the hook-up portion 15 is provided at a center, and two memory cell array portions 14 sandwich the hook-up portion 15. The semiconductor device of the present embodiment may adopt the structure illustrated in FIG. 6 in place of the structure illustrated in FIG. 2.

Figure 7:
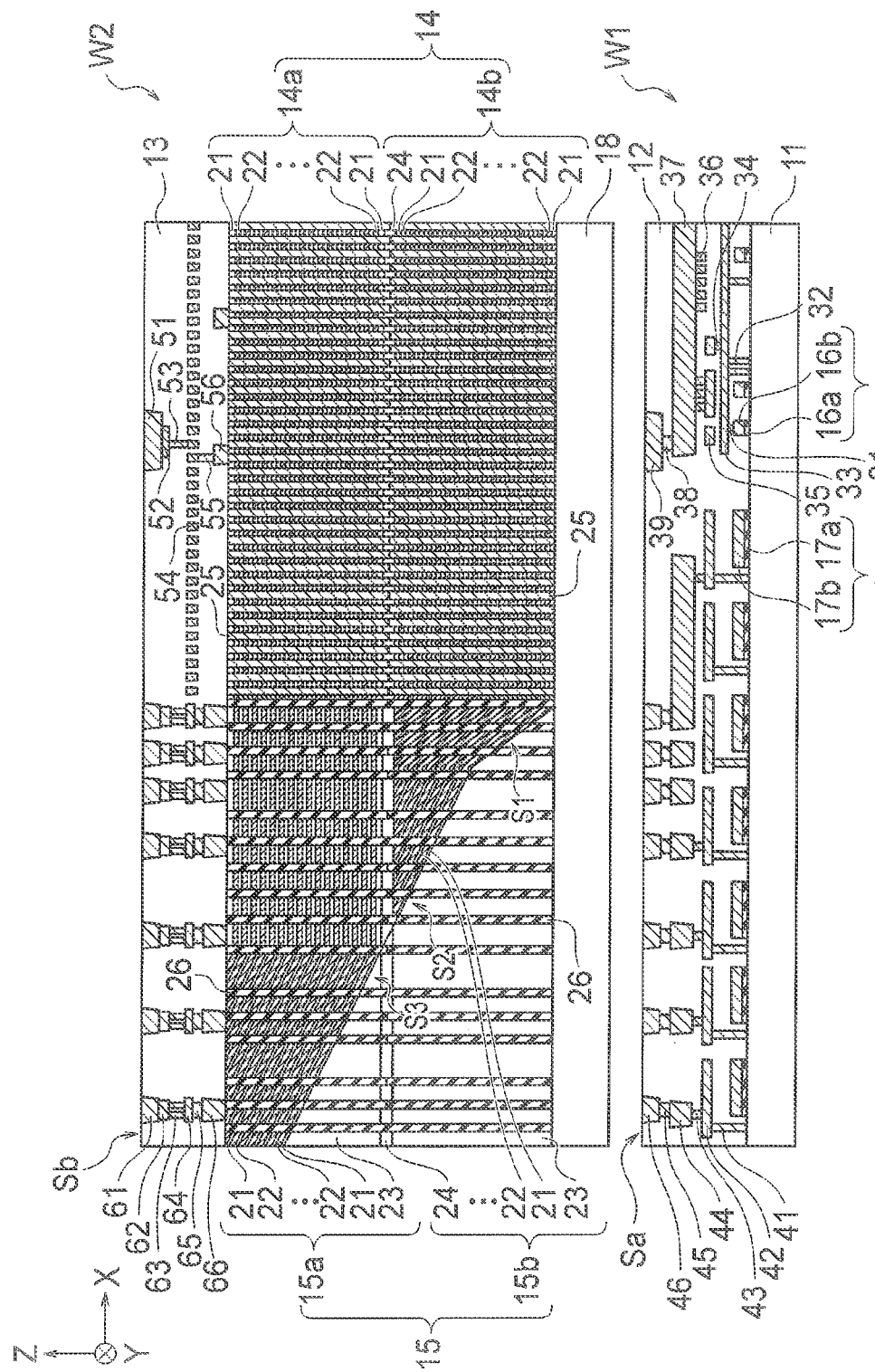
FIGS. 7 and 8 are cross-sectional views illustrating a method of manufacturing the semiconductor device of the first embodiment.
Figure 8:
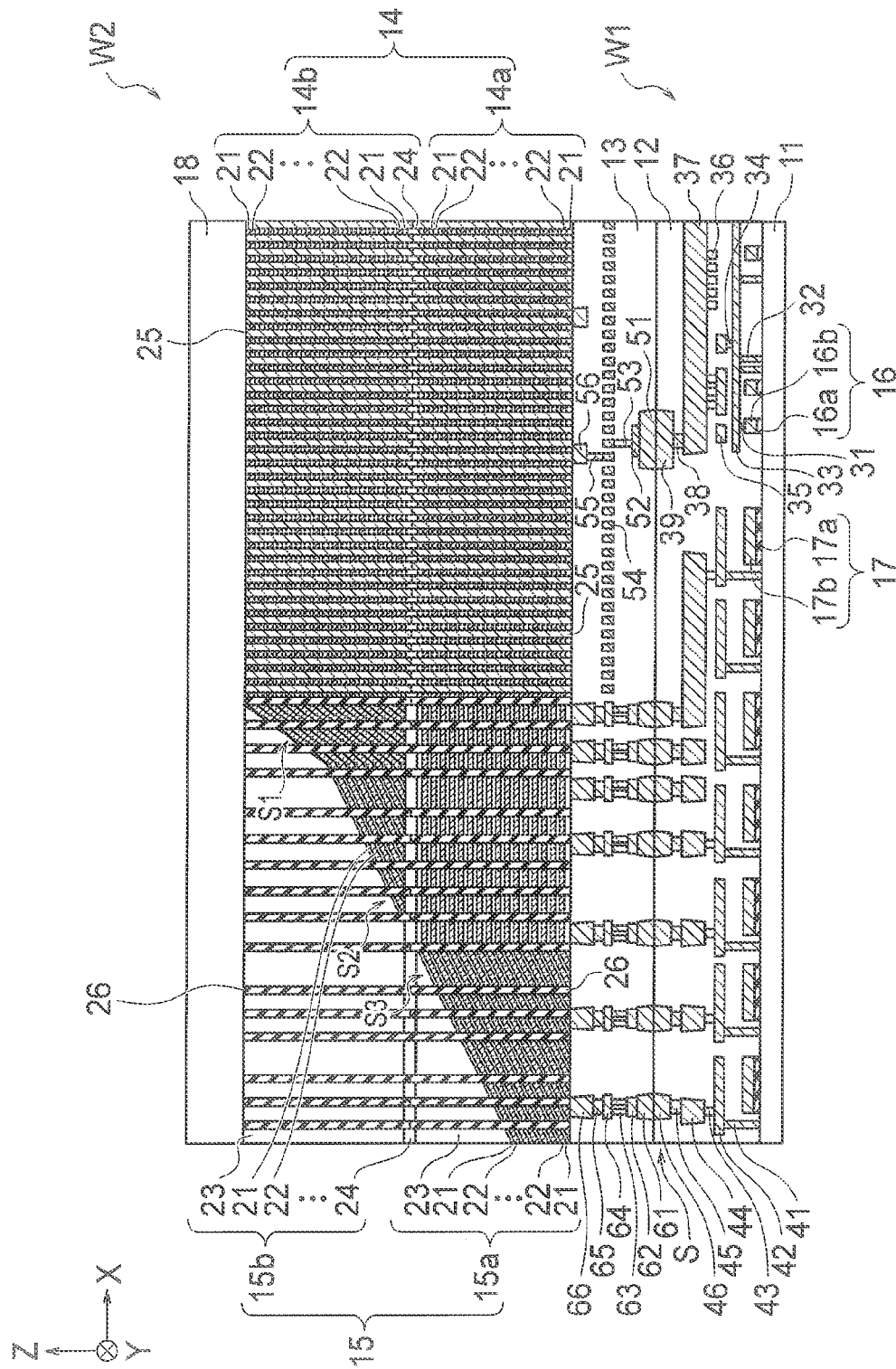

FIGS. 7 and 8 are cross-sectional views illustrating a method of manufacturing the semiconductor device of the first embodiment.

FIG. 7 illustrates a circuit wafer W1 including a plurality of circuit regions 1, and an array wafer W2 including a plurality of array regions 2. A reference symbol Sa represents an upper face of the circuit wafer W1, and a reference symbol Sb represents an upper face of the array wafer W2. The array wafer W2 illustrated in FIG. 7 faces a direction opposite to a direction of the array region 2 illustrated in FIG. 1. The semiconductor device of the present embodiment is manufactured by bonding the circuit wafer W1 and the array wafer W2. FIG. 7 illustrates the array wafer W2 before the direction is inverted for bonding, and FIG. 1 illustrates the array region 2 after the direction is inverted for bonding, and bonding and dicing are performed.

The array wafer W2 includes a substrate 18 provided below the memory cell array portion 14 and below the hook-up portion 15, in addition to the components illustrated in FIG. 1. The substrate 18 is, for example, a semiconductor substrate such as a silicon substrate.

In the present embodiment, first, the inter layer dielectric 12, the transistors 16 and 17, the metal pads 39 and 46, and the like are formed on the substrate 11 of the circuit wafer W1, and the memory cell array portion 14, the hook-up portion 15, the columnar portions 25, the beam portions 26, the inter layer dielectric 13, the interconnect layers 56 and 66, the metal pads 51 and 61, and the like are formed on the substrate 18 of the array wafer W2, as illustrated in FIG. 7. The memory cell array portion 14 is formed so as to include the stacked film 14b on the substrate 18 and the stacked film 14a on the stacked film 14b. The hook-up portion 15 is formed so as to include the stacked film 15b on the substrate 18 and the stacked film 15a on the stacked film 15b.

Next, as illustrated in FIG. 8, the circuit wafer W1 and the array wafer W2 are bonded by mechanical pressure. As a result, the inter layer dielectric 12 and the inter layer dielectric 13 are bonded. Thereafter, the circuit wafer W1 and the array wafer W2 are annealed. As a result, the metal pads 39 and the metal pads 51 are joined, and the metal pads 46 and the respective metal pads 61 are joined.

Thereafter, the substrate 11 is made thin by chemical mechanical polishing (CMP). After the substrate 18 is removed by the CMP, the circuit wafer W1 and the array wafer W2 are cut into a plurality of chips. The semiconductor device in FIG. 1 is manufactured in such a manner. The interconnect layer 71, the insulator 72, the insulator 73, the insulator 74, the via plugs 75, the metal pads 76, and the insulator 77 illustrated in FIG. 1 are formed on the memory cell array portion 14 and the hook-up portion 15, for example, after the substrate 11 is made thin and the substrate 18 is removed.

FIGS. 9 to 14 are cross-sectional views illustrating a method of manufacturing the array wafer W2 of the first embodiment.

Figure 9:
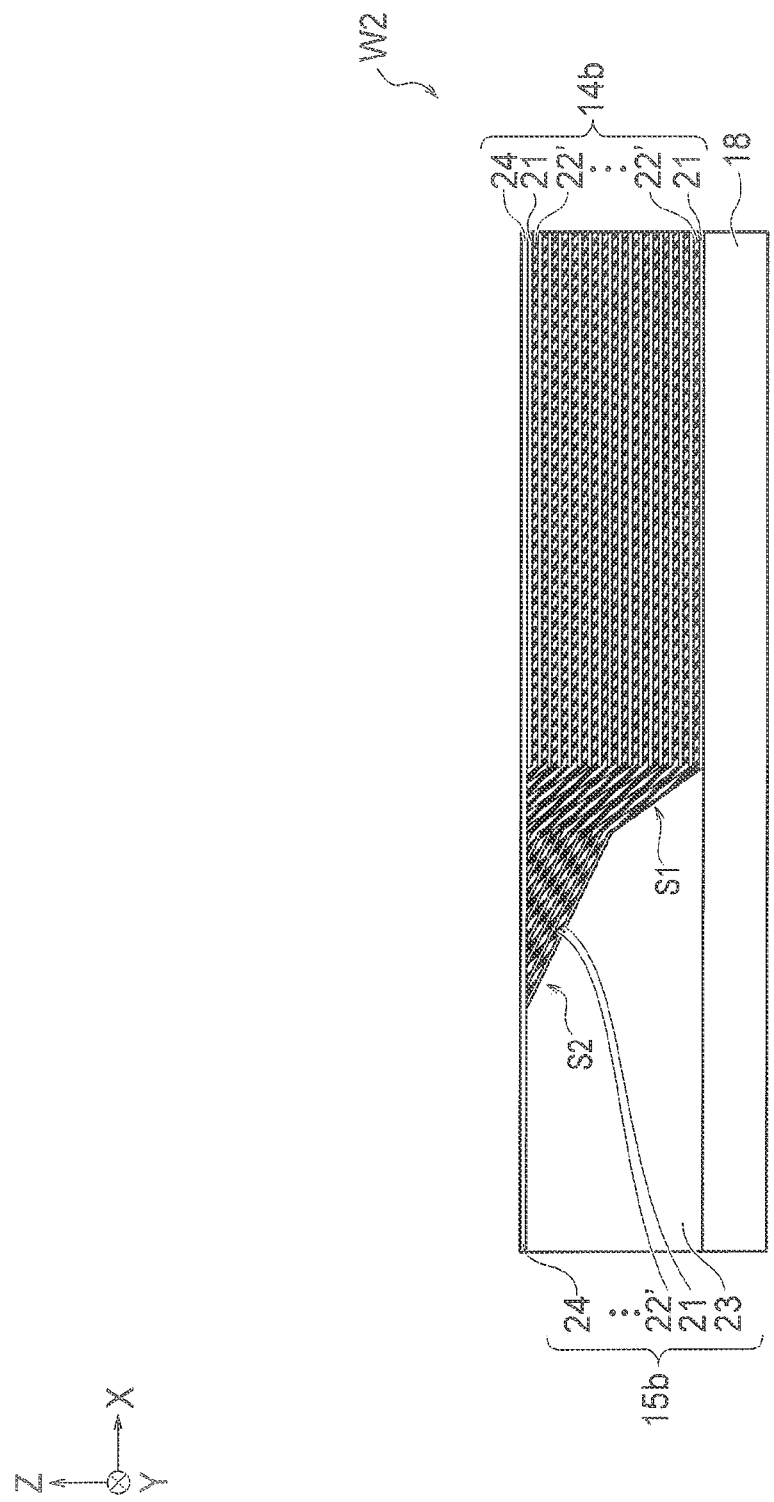
FIGS. 9 to 14 are cross-sectional views illustrating a method of manufacturing an array wafer W2 of the first embodiment.

First, the stacked films 14b and 15b including the plurality of insulating layers 21, a plurality of sacrificial layers 22', the insulator 23, and the insulator 24 are formed on the substrate 18 (FIG. 9). The sacrificial layers 22' are layers replaced with the electrode layers 22 in a process described below, and are, for example, silicon nitride films. Each of the sacrificial layers 22' is an example of a first layer.

The stacked films 14b and 15b illustrated in FIG. 9 are formed, for example, in the following manner. First, the insulator 23 is formed on the substrate 18. The insulator 23 is formed so as to have the face S1 that is inclined by a certain angle to the upper face of the substrate 18 and the face S2 that is inclined by another angle to the upper face of the substrate 18. The faces S1 and S2 are each the lower face of the insulator 23 in FIG. 1, whereas the faces S1 and S2 are each the upper face of the insulator 23 in FIG. 9. The angle of the face S2 to the upper face of the substrate 18 is set less than the angle of the face S1 to the upper face of the substrate 18. Therefore, the face S1 is steeply inclined, whereas the face S2 is gently inclined. Next, the plurality of insulating layers 21 and the plurality of sacrificial layers 22' are alternately formed on the substrate 18 with the insulator 23 in between. As a result, a portion of the insulating layers 21 and a portion of the sacrificial layers 22' are formed on the faces S1 and S2. The insulating layers 21 and the sacrificial layers 22' are processed such that an upper face of an uppermost layer among the insulating layers 21 and the sacrificial layers 22' has a shape close to a flat face. The insulator 24 is formed on the upper face of the uppermost layer among the insulating layers 21 and the sacrificial layers 22'.

In the present embodiment, an upper face and a lower face of each of the sacrificial layers 22' in the stacked film 14b are parallel to the upper face of the substrate 18, and the faces S1 and S2 are inclined to the upper face and the lower face of each of the sacrificial layers 22' in the stacked film 14b.

Figure 10:
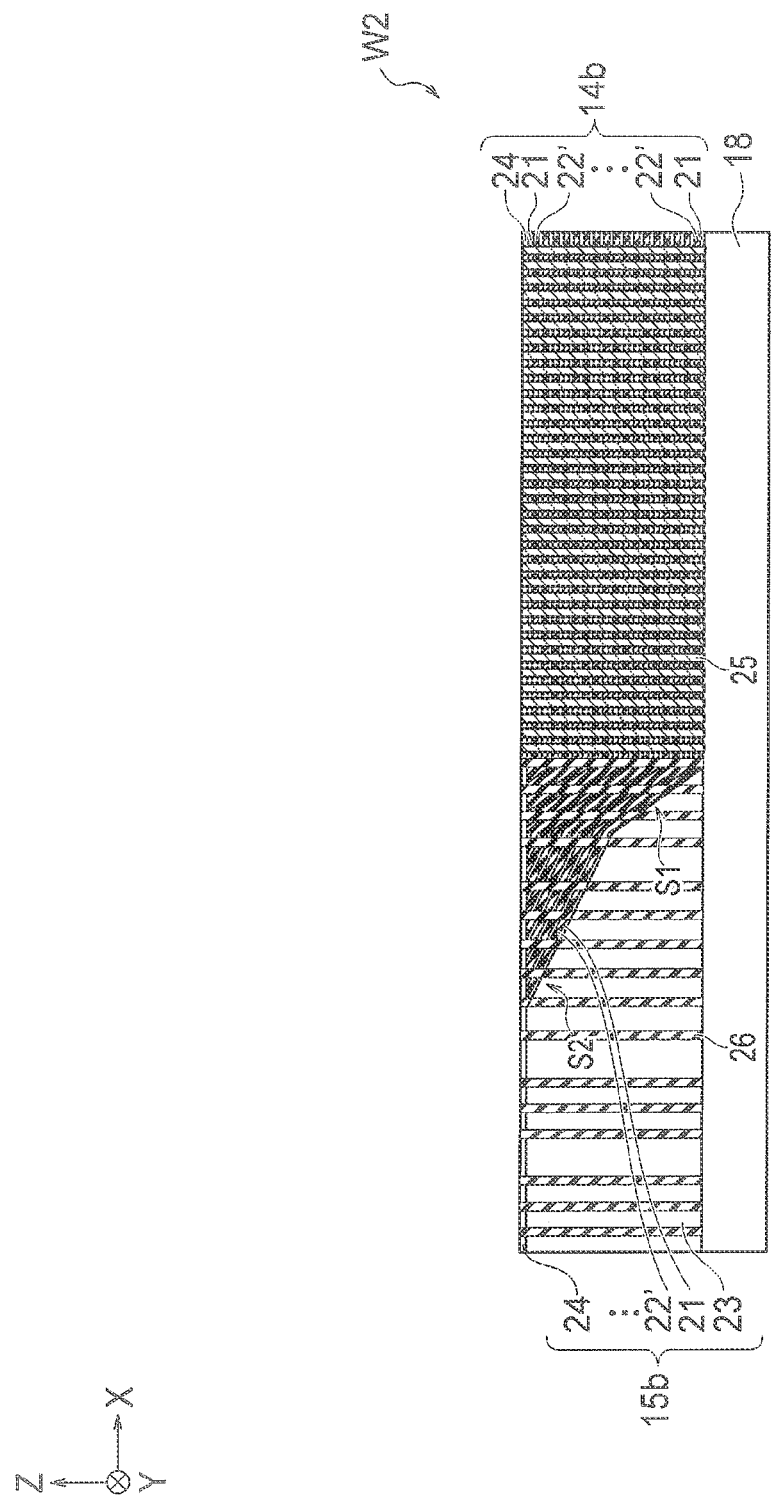

Next, a plurality of holes penetrating through the stacked films 14b and 15b are formed, the plurality of columnar portions 25 are partially formed in the respective holes of the stacked film 14b, and the plurality of beam portions 26 are partially formed in the respective holes of the stacked film 15b (FIG. 10). Each of the columnar portions 25 in the stacked film 14b is formed by forming the block insulator 25a, the charge storage layer 25b, the tunnel insulator 25c, the channel semiconductor layer 25d, and the core insulator 25e in order in each of the holes of the stacked film 14b (see FIG. 3). Each of the beam portions 26 in the stacked film 15b is formed by embedding a silicon oxide film in each of the holes of the stacked film 15b.

Figure 11:
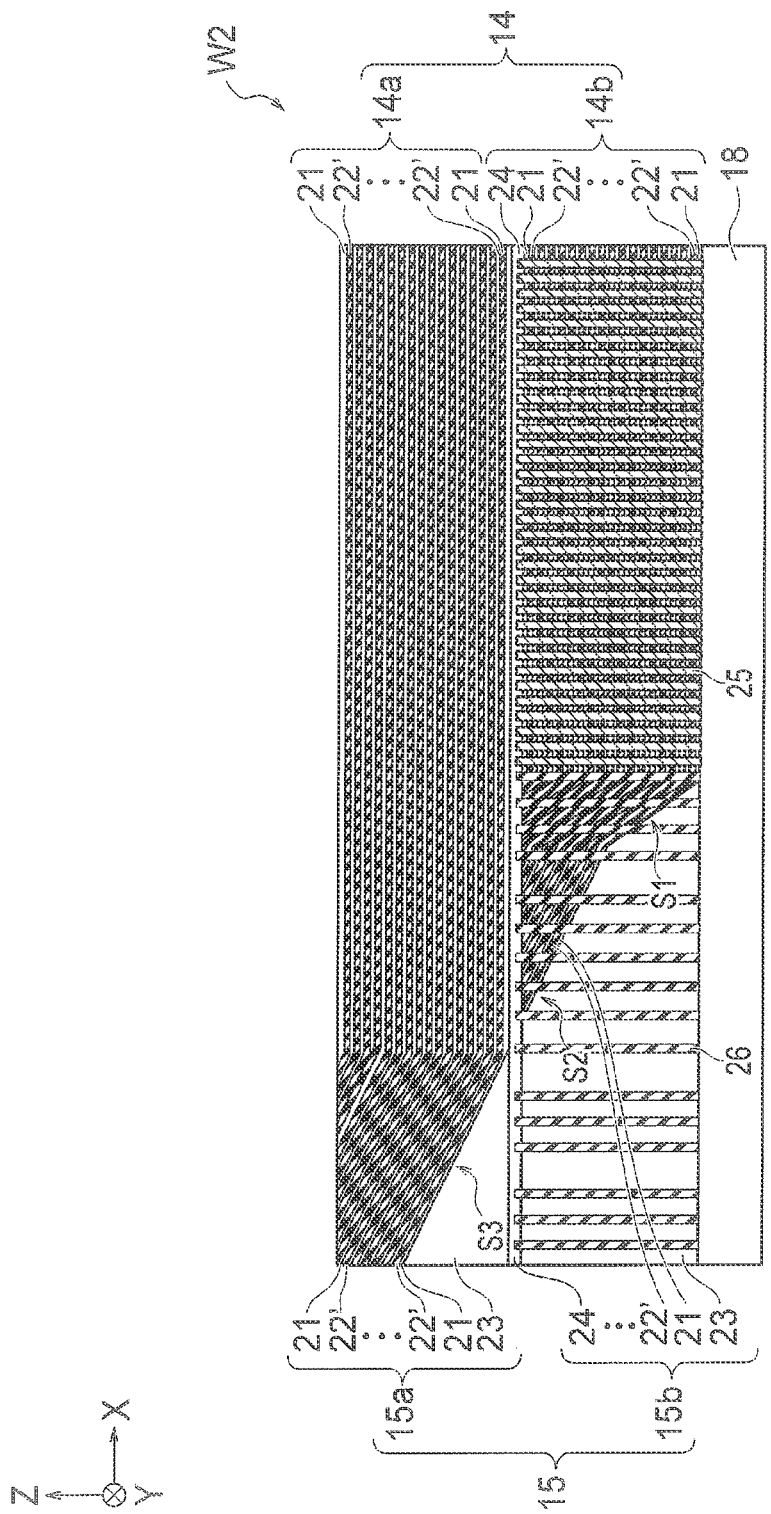

Next, after a remaining portion of the insulator 24 is formed on the substrate 18, the stacked films 14a and 15a including the plurality of insulating layers 21, the plurality of sacrificial layers 22', the insulator 23, and the insulator 24 are formed on the stacked films 14*b* and 15*b* (FIG. 11). These sacrificial layers 22' are also layers replaced with the electrode layers 22 in a process described below, and are, for example, silicon nitride films. Each of the sacrificial layers 22' is also an example of the first layer.

The stacked films 14*a* and 15*a* illustrated in FIG. 11 are formed, for example, in the following manner. First, the insulator 23 is formed on the stacked films 14*b* and 15*b*. The insulator 23 is formed so as to have the face S3 that is inclined by a certain angle to the upper face of the substrate 18. The face S3 is the lower face of the insulator 23 in FIG. 1, whereas the face S3 is the upper face of the insulator 23 in FIG. 11. The angle of the face S3 to the upper face of the substrate 18 is set to be substantially equal to the angle of the face S2 to the upper face of the substrate 18. Therefore, the face S1 is steeply inclined, whereas the faces S2 and S3 are gently inclined. The face S1 is an example of a first upper face, and each of the faces S2 and S3 is an example of a second upper face. Next, the plurality of insulating layers 21 and the plurality of sacrificial layers 22' are alternately formed on the stacked films 14*b* and 15*b* with the insulator 23 in between. As a result, a portion of the insulating layers 21 and a portion of the sacrificial layers 22' are formed on the face S3. The insulating layers 21 and the sacrificial layers 22' are processed such that an upper face of an uppermost layer among the insulating layers 21 and the sacrificial layers 22' has a shape close to a flat face.

In the present embodiment, the upper face and the lower face of each of the sacrificial layers 22' in the stacked films 14*b* and 14*a* are parallel to the upper face of the substrate 18, and the faces S1 to S3 are inclined to the upper face and the lower face of each of the sacrificial layers 22' in the stacked films 14*b* and 14*a*.

Figure 12:
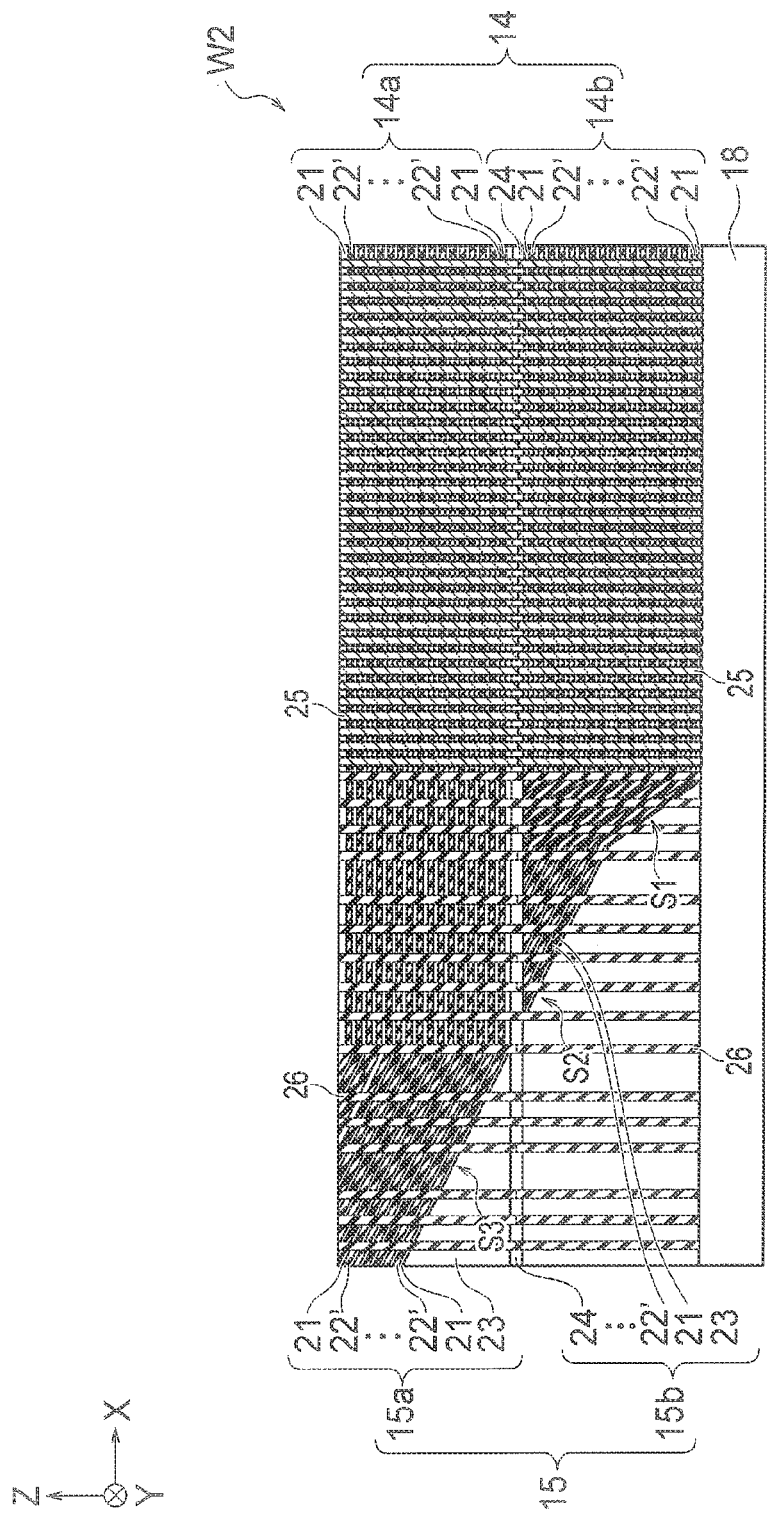

Next, a plurality of holes penetrating through the stacked films 14*a* and 15*a* are formed, remaining portions of the plurality of columnar portions 25 are formed in the holes of the stacked film 14*a*, and remaining portions of the plurality of beam portions 26 are formed in the holes of the stacked film 15*a* (FIG. 12). The holes in the stacked film 14*a* are formed so as to reach the columnar portions 25 in the stacked film 14*b*. The holes in the stacked film 15*a* are formed so as to reach the beam portions 26 in the stacked film 15*b*. Each of the columnar portions 25 in the stacked film 14*a* is formed by forming the block insulator 25*a* the charge storage layer 25*b*, the tunnel insulator 25*c*, the channel semiconductor layer 25*d*, and the core insulator 25*e* in order in each of the holes of the stacked film 14*a*. The columnar portions 25 in the stacked film 14*a* are formed on the respective columnar portions 25 in the stacked film 14*b*. Each of the beam portions 26 in the stacked film 15*a* is formed by embedding a silicon oxide film in each of the holes of the stacked film 15*a*. The beam portions 26 in the stacked film 15*a* are formed on the respective beam portions 26 in the stacked film 15*b*. The columnar portions 25 are formed in the stacked films 14*b* and 14*a*, and the beam portions 26 are formed in the stacked films 15*b* and 15*a*, in the above-described manner.

In the present embodiment, the plurality of holes may be formed in the stacked films 14*b* and 15*b* in the process of FIG. 10, the plurality of holes may be formed in the stacked films 14*a* and 15*a* in the process of FIG. 12, and then the columnar portions 25 and the beam portions 26 may be formed in the holes of the stacked films 14*b*, 14*a*, 15*b*, and 15*a*. This makes it possible to form the columnar portions 25 and the beam portions 26 in the stacked films 14*b* and 15*b*, and the columnar portions 25 and the beam portions 26 in the stacked films 14*a* and 15*a*, in the same process.

Further, in the present embodiment, joint portions between the portions of the columnar portions 25 and the remaining portions of the columnar portions 25 may be formed in the insulator 24. Each of the joint portions is formed, for example, so as to have a diameter greater than a diameter of these portions of the columnar portions 25.

Further, in the process of FIG. 12, as the holes in the stacked film 15*a*, holes for the insulators 27 and the punch plugs 28 are formed (see FIG. 4). The holes are formed so as to reach the sacrificial layers 22' in the stacked film 15*b*. The insulator 27 and the punch plug 28 are formed in order in each of the holes in the process of FIG. 12.

Figure 13:
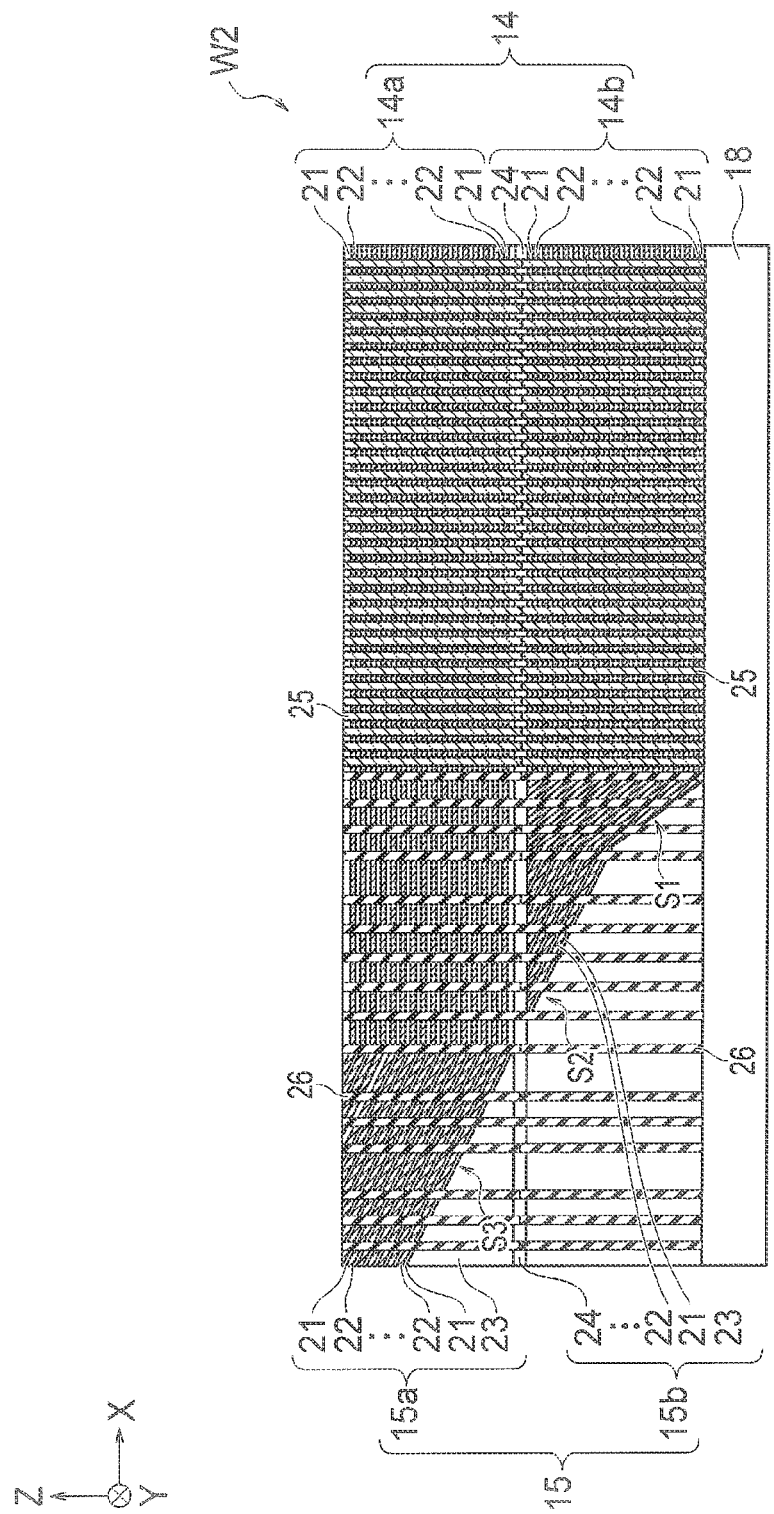

Next, the sacrificial layers 22' in the stacked films 14*b*, 14*a*, 15*b*, and 15*a* are replaced with the electrode layers 22 (FIG. 13). As a result, the stacked films 14*b*, 14*a*, 15*b*, and 15*a* each alternately including the plurality of insulating layers 21 and the plurality of electrode layers 22 are formed on the substrate 18.

Replacement from the sacrificial layers 22' to the electrode layers 22 is performed, for example, in the following manner. First, slits (not illustrated) penetrating through the stacked films 14*b* and 14*a* or the stacked films 15*b* and 15*a* are formed. Next, the sacrificial layers 22' are removed by wet etching through the slits. Next, the electrode layers 22 are formed in cavities formed among the insulating layers 21 due to removal of the sacrificial layers 22'. Thereafter, the slits are embedded with insulators. The memory cell array portion 14 and the hook-up portion 15 are formed on the substrate 18 in the above-described manner.

In a case where the electrode layers 22 are formed in place of the sacrificial layers 22' in the process of FIG. 9 and in the process of FIG. 11, replacement in the process of FIG. 13 is unnecessary. In this case, each of the electrode layers 22 is an example of the first layer.

Figure 14:
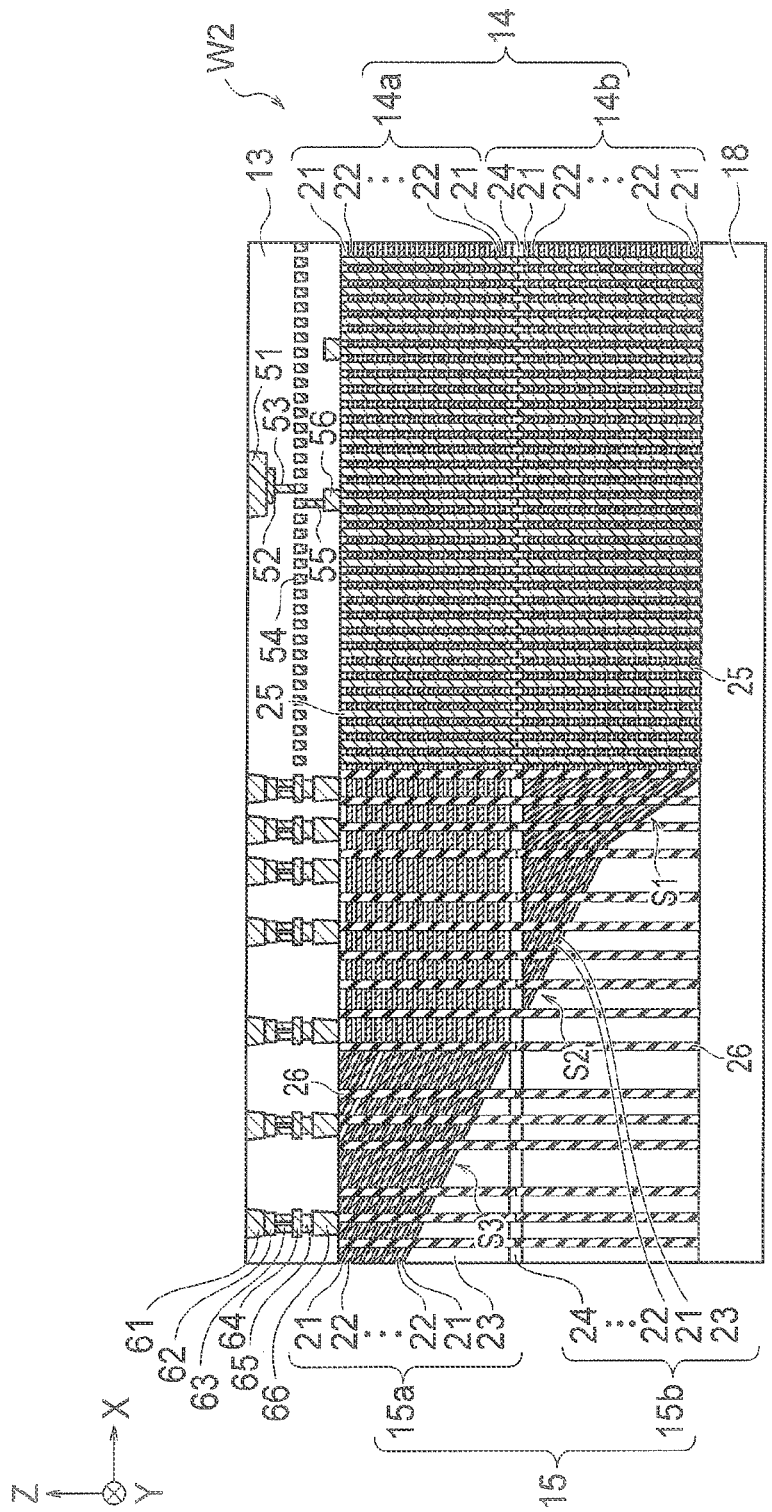

Next, the inter layer dielectric 13, the interconnect layers 56 and 66, the metal pads 51 and 61, and the like are formed on the memory cell array portion 14 and the hook-up portion 15 (FIG. 14). The array wafer W2 of the present embodiment is manufactured in such a manner. The processes illustrated in FIGS. 9 to 14 correspond to an example of the process illustrated in FIG. 7. The array wafer W2 is then bonded to the circuit wafer W1 in the process illustrated in FIG. 8.

FIGS. 15A to 15E are a plan view and cross-sectional views illustrating a method of forming the insulator 23 of the first embodiment.

Figure 15A:
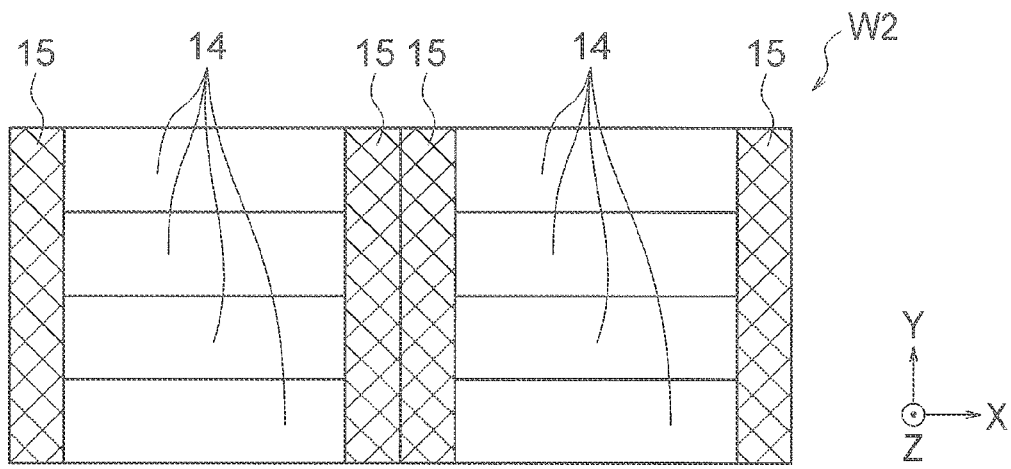
FIGS. 15A to 15E are a plan view and cross-sectional views illustrating a method of forming an insulator 23 of the first embodiment.

FIG. 15A illustrates a region corresponding to one semiconductor device (one array region 2) on the upper face of the array wafer W2. FIG. 15A illustrates a plurality of memory cell array portions 14 (planes) and a plurality of hook-up portions 15.

Figure 15B:
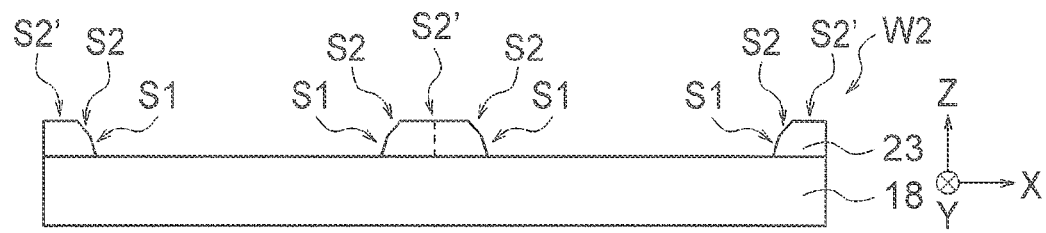

FIG. 15B schematically illustrates a cross-section of the array wafer W2 when insulators 23 are formed on the substrate 18 in the process of FIG. 9. The insulators 23 illustrated in FIG. 15B are formed at positions corresponding to the respective hook-up portions 15 illustrated in FIG. 15A. Each of the insulators 23 has the face S1, the face S2, and a face S2' as upper faces. The faces S1 and S2 are inclined to the XY plane, whereas the faces S2' are substantially parallel to the XY plane.

Figure 15C:
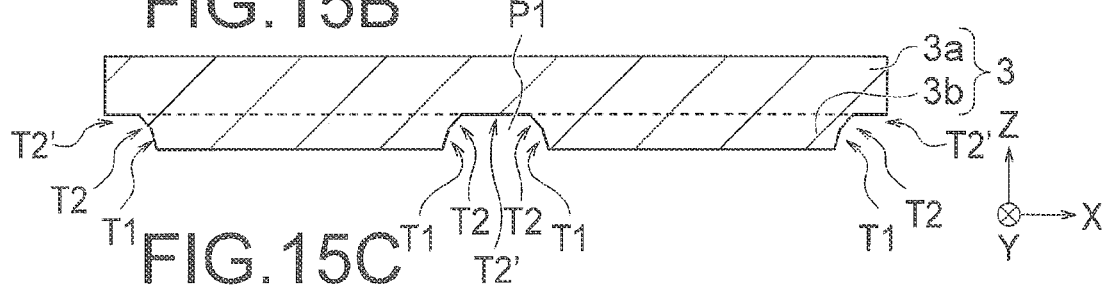

FIG. 15C illustrates a cross-section of a template 3 to form the insulators 23 illustrated in FIG. 15B. The template 3 includes a portion 3*a* and a portion 3*b* provided below the portion 3*a*, and includes a plurality of concave portions P1 in the portion 3*b*. Each of the concave portions P1 has faces T1, T2, and T2' that have the areas and the inclinations same as the areas and the inclinations of the faces S1, S2, and S2' of each of the insulators 23. In FIG. 15C, an upper face and a lower face of the template 3 are parallel to the XY plane. The faces T1 and T2 are inclined to the upper face and the lower face of the template 3, and the faces T2' are substantially parallel to the upper face and the lower face of the template 3. Each of the upper face and the lower face of the template 3 is an example of a predetermined face. The faces T1, T2, and T2' are respectively examples of first, second, and third lower faces, and angles of the faces T1 and T2 to the upper face and the lower face of the template 3 are respectively examples of first and second angles. The angle of each of the faces T2 to the XY plane is less than the angle of each of the faces T1 to the XY plane. The angle of each of the faces T2' to the XY plane is substantially zero degrees.

The insulators 23 in FIG. 15B are formed by using, for example, the template 3 in FIG. 15C. More specifically, a material of the insulators 23 is applied to the upper face of the substrate 18, the template 3 is pressed against the material, and the material having entered the concave portions P1 of the template 3 is cured. As a result, the insulators 23 each having the faces S1, S2, and S2' are formed. The material in the concave portions P1 may be cured by being irradiated with light, or may be cured by being heated. In the former case, the template 3 is made of a translucent member. In the latter case, the template 3 is made of a heat transfer member. In the present embodiment, the material in the concave portions P1 is cured by light. Therefore, the template 3 is made of a quartz substrate.

Figure 15D:
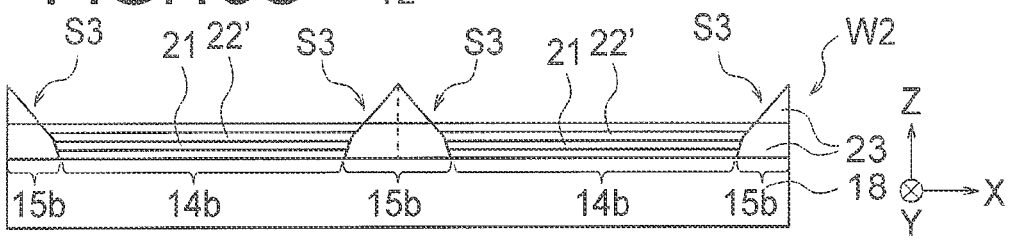

FIG. 15D schematically illustrates the cross-section of the array wafer W2 when the insulators 23 are formed on the stacked films 15b in the processes of FIG. 11. The insulators 23 illustrated in FIG. 15D are formed at the positions corresponding to the respective hook-up portions 15 illustrated in FIG. 15A. Each of the insulators 23 has the face S3 as the upper face. The faces S3 are inclined to the XY plane. The insulating layers 21 and the sacrificial layers 22' are actually inclined near the faces S1 and S2 (see FIG. 9, etc.); however, the insulating layers 21 and the sacrificial layers 22' are illustrated without inclination for convenience in FIG. 15D.

Figure 15E:
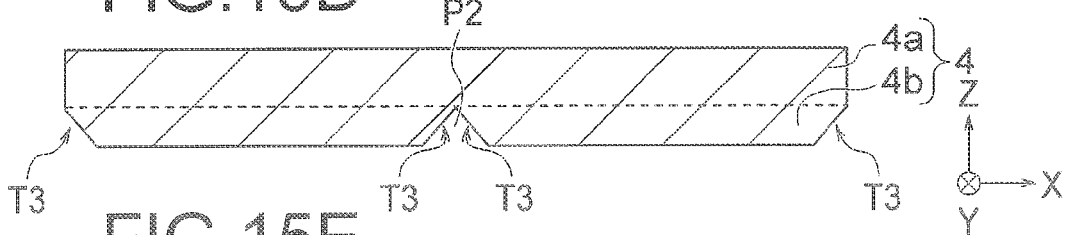

FIG. 15E illustrates a cross-section of a template 4 to form the insulators 23 illustrated in FIG. 15D. The template 4 includes a portion 4a and a portion 4b provided below the portion 4a, and includes a plurality of concave portions P2 in the portion 4b. Each of the concave portions P2 has a face T3 that has the area and the inclination same as the area and the inclination of the face S3 of each of the insulators 23. In FIG. 15E, an upper face and a lower face of the template 4 are parallel to the XY plane. The faces T3 are inclined to the upper face and the lower face of the template 4. The angle of each of the faces T3 to the XY plane is substantially equal to the angle of each of the faces T2 to the XY plane.

The insulators 23 in FIG. 15D are formed by using, for example, the template 4 in FIG. 15E. More specifically, a material of the insulators 23 is applied to the upper faces of the stacked films 14b and 15b, the template 4 is pressed against the material, and the material having entered the concave portions P2 of the template 4 is cured. As a result, the insulators 23 each having the face S3 are formed. The material in the concave portions P2 may be cured by being irradiated with light, or may be cured by being heated. In the former case, the template 4 is made of a translucent member. In the latter case, the template 4 is made of a heat transfer member. In the present embodiment, the material in the concave portions P2 is cured by light. Therefore, the template 4 is made of a quartz substrate.

Figure 16A:
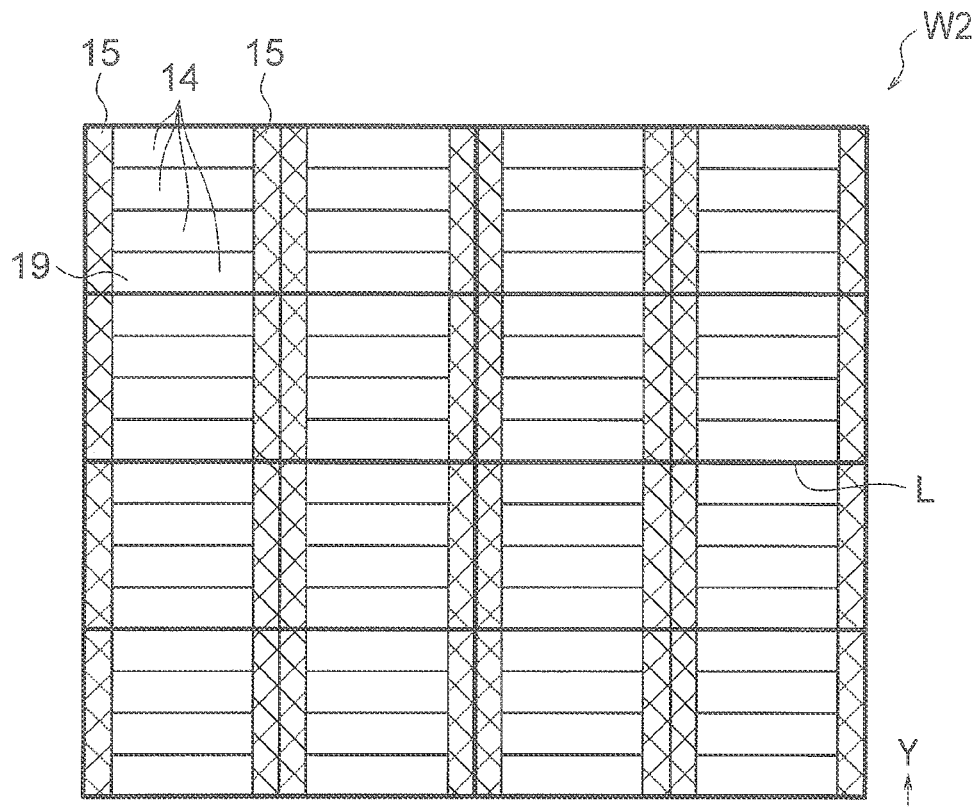
FIGS. 16A to 16C are other plan view and cross-sectional views illustrating the method of forming the insulator 23 of the first embodiment.
Figure 16B:
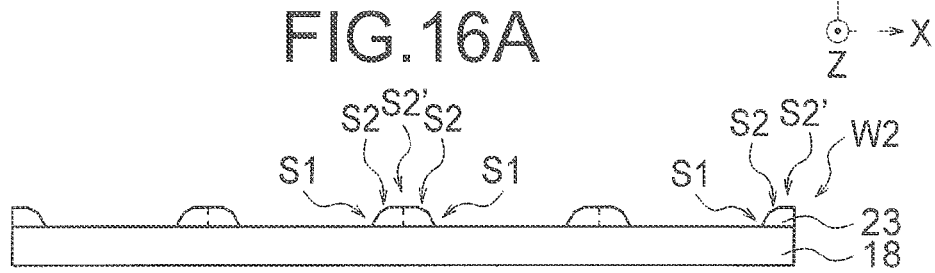
Figure 16C:
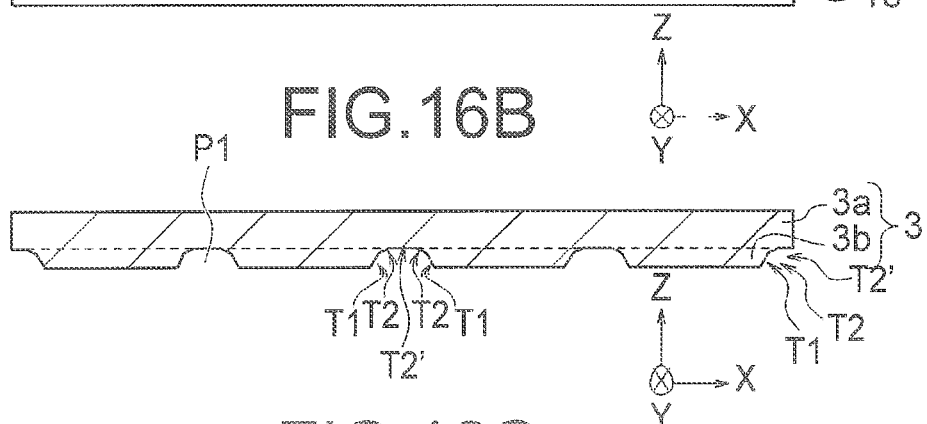

FIGS. 16A to 16C are other plan view and cross-sectional views illustrating the method of forming the insulator 23 of the first embodiment.

FIG. 16A illustrates a region corresponding to eight semiconductor devices (eight array regions 2) on the upper face of the array wafer W2. FIG. 16A illustrates a plurality of memory cell array portions 14 (planes) and a plurality of hook-up portions 15 as with FIG. 15A. FIG. 16A further illustrates dicing lines L among the array regions 2 by thick lines.

FIG. 16B schematically illustrates a cross-section of the array wafer W2 when insulators 23 are formed on the substrate 18 in the process of FIG. 9. The insulators 23 illustrated in FIG. 16B are formed at positions corresponding to the respective hook-up portions 15 illustrated in FIG. 16A. In FIG. 16B, center insulators 23 are disposed on the dicing line L.

FIG. 16C illustrates a cross-section of the template 3 to form the insulators 23 illustrated in FIG. 16B. FIG. 16C illustrates the cross-section of the whole of the template 3. The template 3 of the present embodiment can form the insulators 23 for the eight array regions 2 at the same time. This is true of the template 4.

Figure 17:
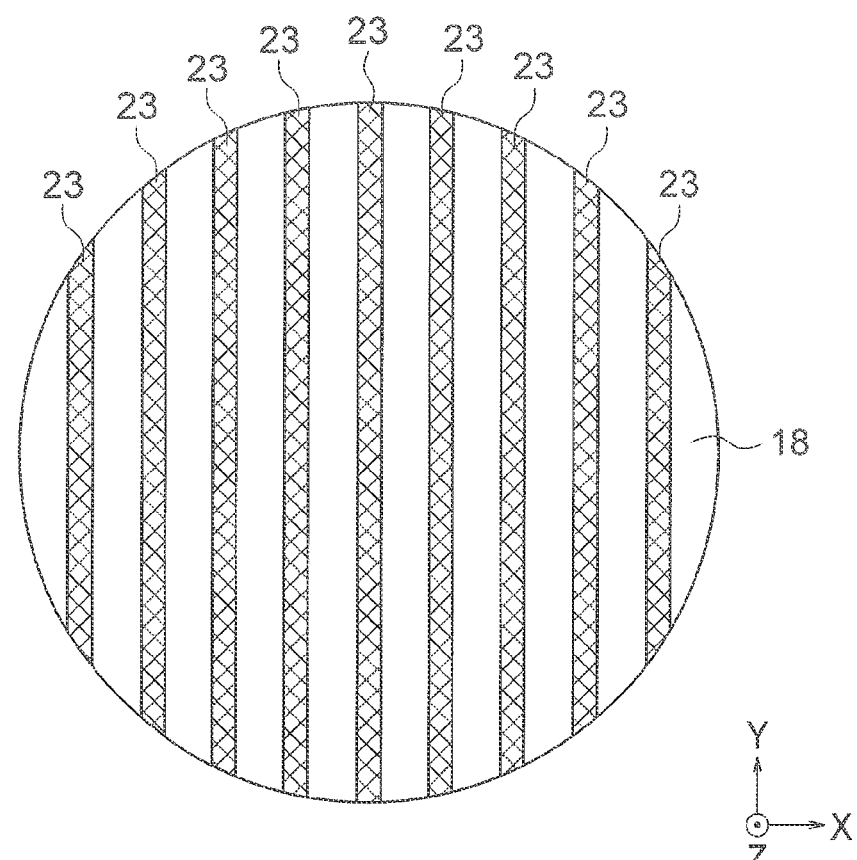
FIG. 17 is another plan view illustrating the method of forming the insulator 23 of the first embodiment.

FIG. 17 is another plan view illustrating the method of forming the insulator 23 of the first embodiment.

FIG. 17 illustrates a planar shape of the insulators 23 formed on the substrate 18 by repeatedly using the templates 3 and 4. In the present embodiment, the plurality of insulators 23 adjacent to one another in the X direction and extending in the Y direction are formed on the substrate 18.

FIGS. 18A to 19C are other cross-sectional views illustrating the method of forming the insulator 23 of the first embodiment.

Figure 18A:
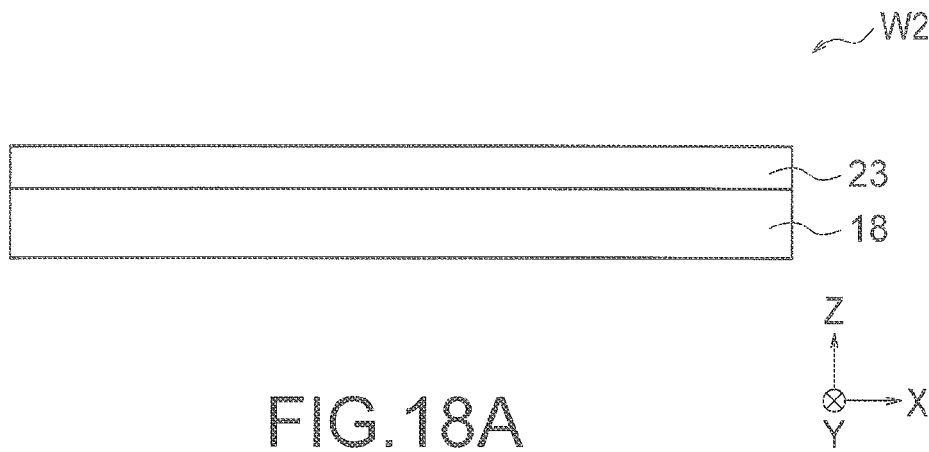
FIGS. 18A to 19C are other cross-sectional views illustrating the method of forming the insulator 23 of the first embodiment.
Figure 18B:
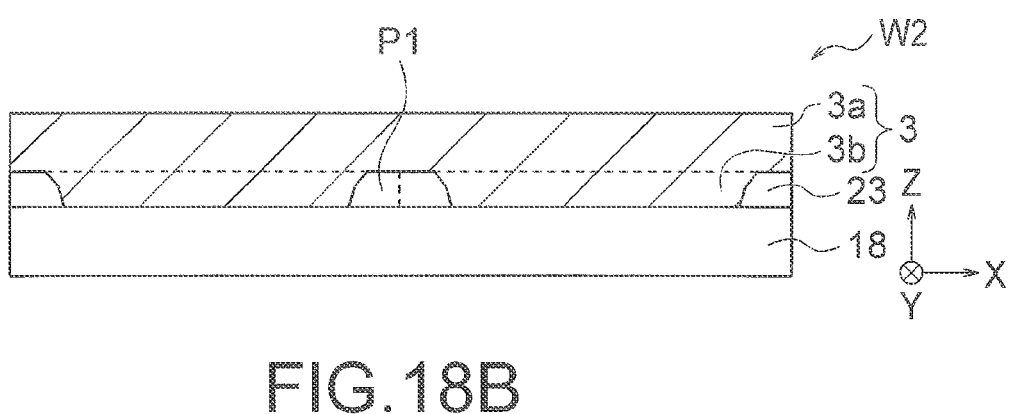
Figure 18C:
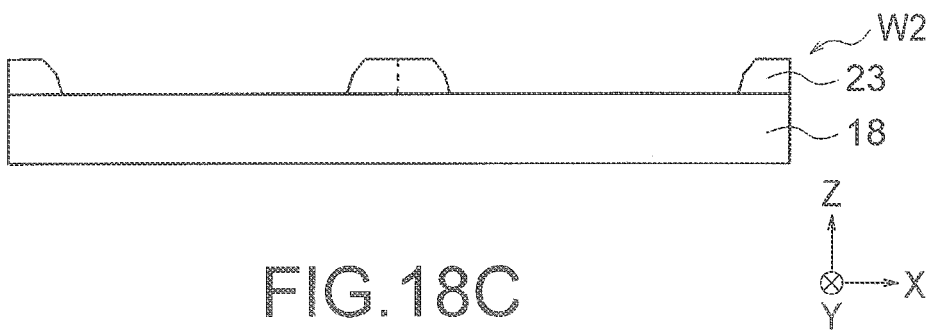

First, the material of insulators 23 is applied to the upper face of the substrate 18 (FIG. 18A). Next, the template 3 is pressed against the material, and then, the material having entered the concave portions P1 of the template 3 is cured (FIG. 18B). Next, the material is demolded from the template 3 (FIG. 18C). As a result, the insulators 23 each having the faces S1, S2, and S2' are formed.

Figure 19A:
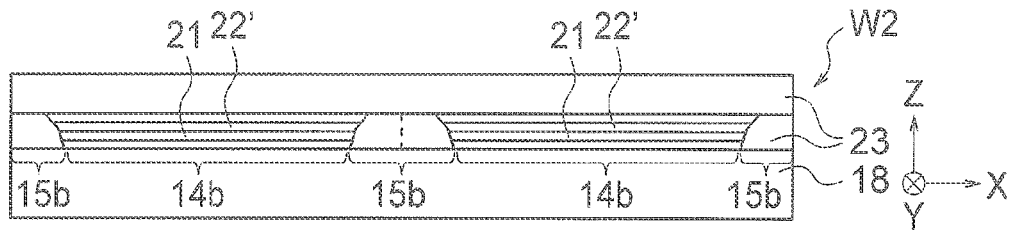
Figure 19B:
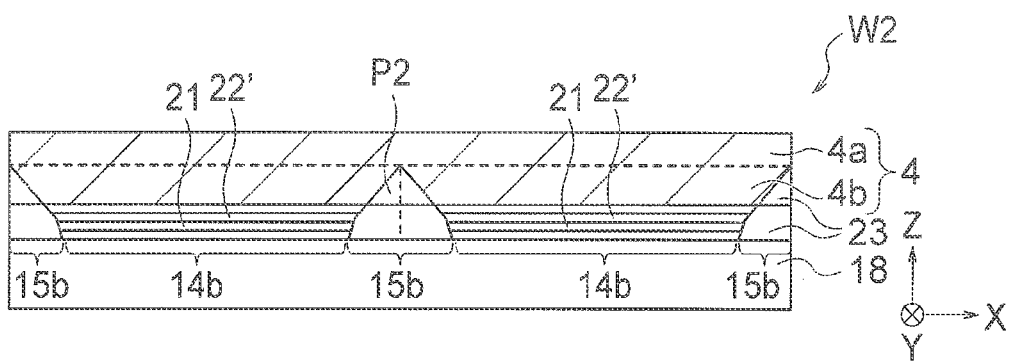
Figure 19C:
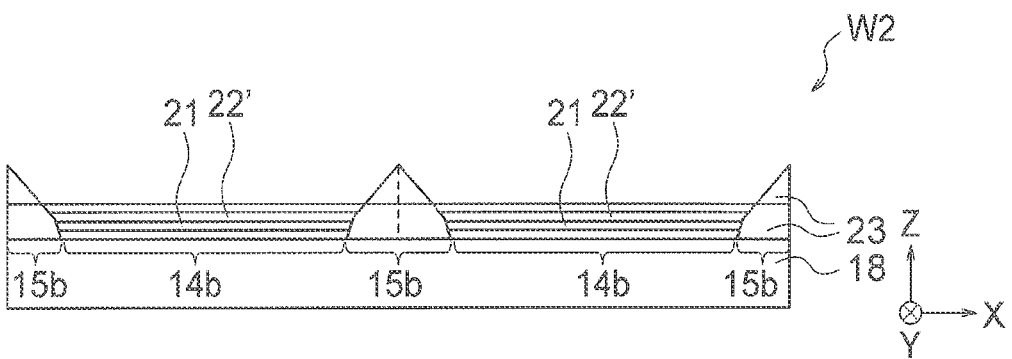

Next, after the above-described processes in FIGS. 9 and 10 are performed, the material of the insulators 23 is applied to the upper faces of the stacked films 14b and 15b (FIG. 19A). Next, the template 4 is pressed against the material, and then, the material having entered the concave portions P2 of the template 4 is cured (FIG. 19B). Next, the material is demolded from the template 4 (FIG. 19C). As a result, the insulators 23 each having the face S3 are formed on the respective insulators 23 each having the faces S1, S2, and S2'. The insulating layers 21 and the sacrificial layers 22' are actually inclined near the faces S1 and S2 (see FIG. 9, etc.); however, the insulating layers 21 and the sacrificial layers 22' are illustrated without inclination for convenience in FIGS. 19A to 19C.

FIGS. 20A to 20D are cross-sectional views illustrating a method of forming an insulator 23 of a modification of the first embodiment.

Figure 20A:
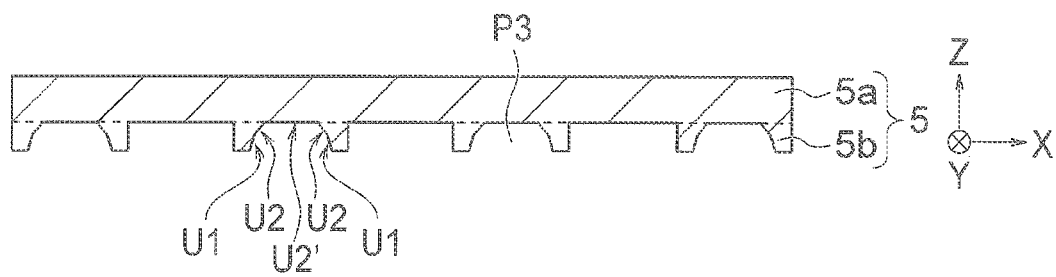
FIGS. 20A to 20D are cross-sectional views illustrating a method of forming an insulator 23 of a modification of the first embodiment.

FIG. 20A illustrates a cross-section of a template 5 to form the insulators 23 illustrated in FIG. 15B. The template 5 includes a portion 5a and a portion 5b provided below the portion 5a, and includes a plurality of concave portions P3 in the portion 5b. Each of the concave portions P3 has faces U1, U2, and U2' that have the areas and the inclinations same as the areas and the inclinations of the faces S1, S2, and S2' of each of the insulators 23. In FIG. 20A, an upper face and a lowermost face of the template 5 are parallel to the XY plane. The faces U1 and U2 are inclined to the upper face and the lowermost face of the template 5, and the faces U2' are substantially parallel to the upper face and the lowermost face of the template 5. Each of the upper face and the lowermost face of the template 5 is an example of the predetermined face. Further, the faces U1, U2, and U2' are respectively examples of first, second, and third lower faces, and angles of the faces U1 and U2 to the upper face and the lowermost face of the template 5 are respectively examples of the first and second angles. The angle of each of the faces U2 to the XY plane is less than the angle of each of the faces U1 to the XY plane. The angle of each of the faces U2' to the XY plane is substantially zero degrees.

Figure 20B:
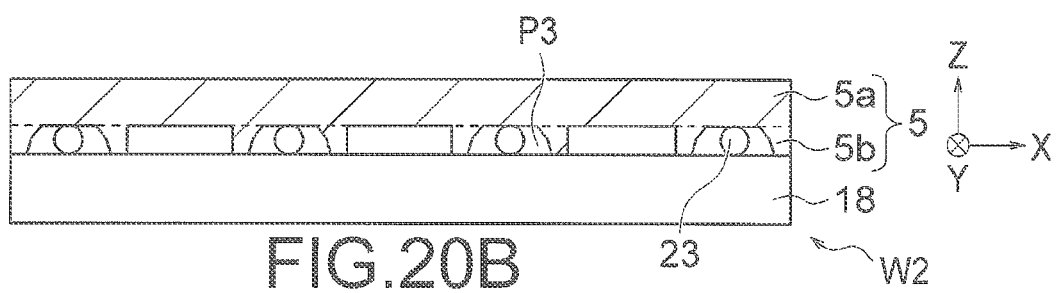
Figure 20C:
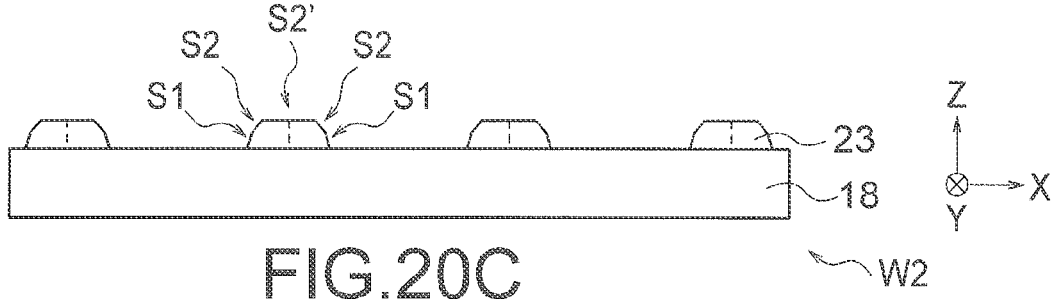

FIG. 20B schematically illustrates the cross-section of the array wafer W2 when the insulators 23 are formed on the substrate 18 in the process of FIG. 9. The template 5 of the present modification is used to form the insulators 23 by an inkjet method. More specifically, the template 5 is placed on the substrate 18, the material of the insulators 23 is discharged into spaces surrounded by the upper face of the substrate 18 and the faces U1, U2, and U2' of the template 5 (i.e., concave portions P3), and the material in the concave portions P3 is cured. As a result, the insulators 23 each having the faces S1, S2, and S2' are formed (FIG. 20C). The material in the concave portions P3 may be cured by being irradiated with light, or may be cured by being heated. In the former case, the template 5 is made of a translucent member. In the latter case, the template 5 is made of a heat transfer member. In the present modification, the material in the concave portions P3 is cured by light. Therefore, the template 5 is made of a quartz substrate.

Figure 20D:
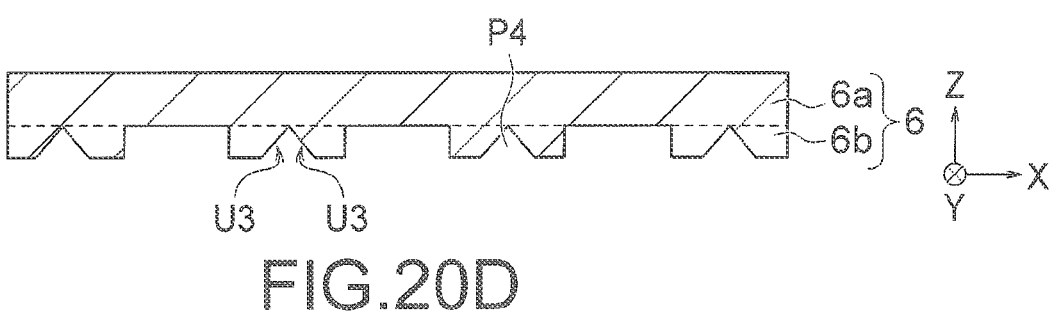
Figure 21A:
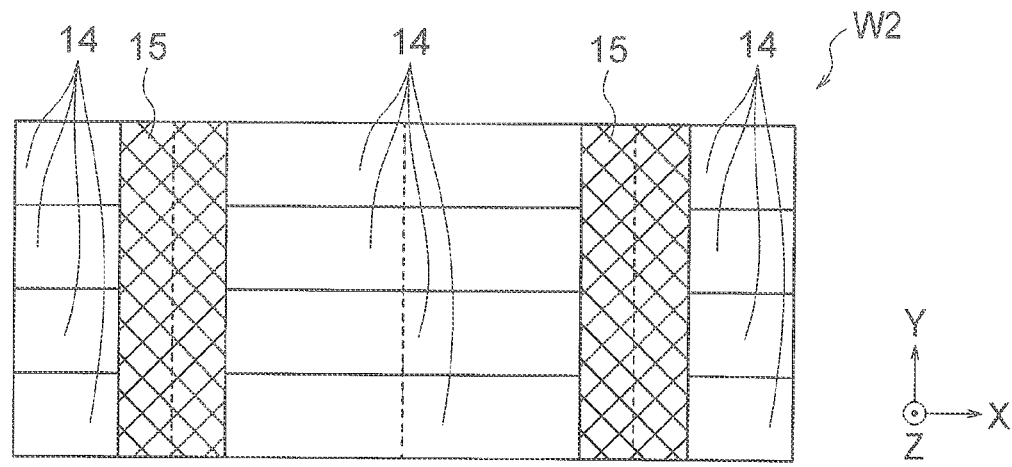
FIGS. 21A to 21E are a plan view and cross-sectional views illustrating a method of forming an insulator 23 of another modification of the first embodiment.
Figure 21B:
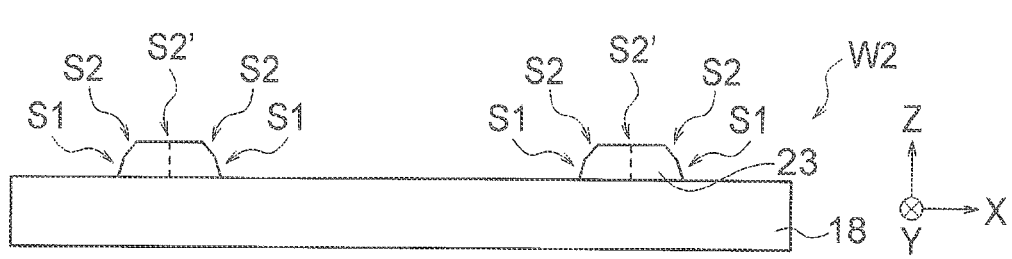
Figure 21C:
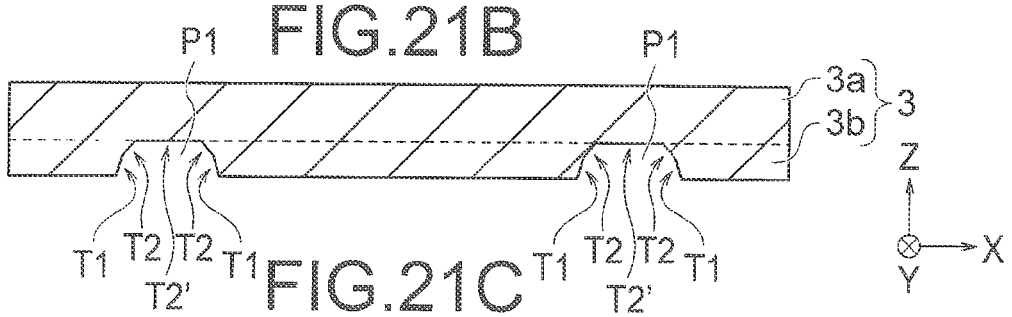
Figure 21D:
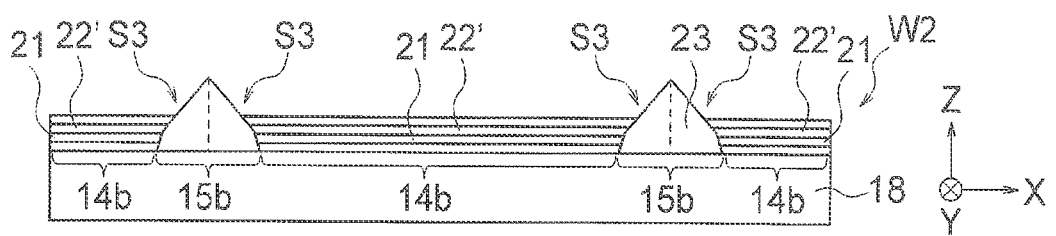
Figure 21E:
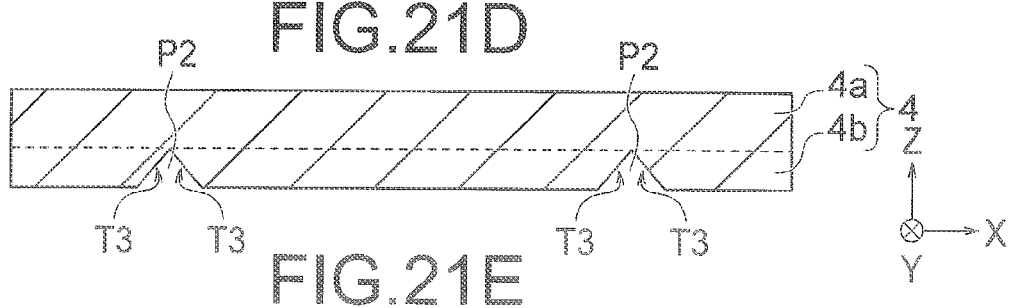

FIG. 20D illustrates a cross-section of a template 6 to form the insulators 23 illustrated in FIG. 15D. The template 6 includes a portion 6a and a portion 6b provided below the portion 6a, and includes a plurality of concave portions P4 in the portion 6b. Each of the concave portions P4 includes a face U3 that has the area and the inclination same as the area and the inclination of the face S3 of each of the insulators 23. In FIG. 20D, an upper face and a lowermost face of the template 6 are parallel to the XY plane. The faces U3 are inclined to the upper face and the lowermost face of the template 6. An angle of each of the faces U3 to the XY plane is substantially equal to the angle of each of the faces U2 to the XY plane.

The template 6 of the present modification is used to form the insulators 23 by an inkjet method, as with the template 5. Therefore, the template 6 is made of, for example, a translucent member or a heat transfer member. In the present modification, the material in the concave portions P4 is cured by light. Therefore, the template 6 is made of a quartz substrate.

FIGS. 21A to 21E are a plan view and cross-sectional views illustrating a method of forming an insulator 23 of another modification of the first embodiment.

FIGS. 21A to 21E respectively correspond to FIGS. 15A to 15E. The method illustrated in FIGS. 15A to 15E is adopted to form, for example, insulators 23 of a semiconductor device including two structures illustrated in FIG. 2. In contrast, the method illustrated in FIGS. 21A to 21E is adopted to form, for example, insulators 23 of a semiconductor device including two structures illustrated in FIG. 6.

As described above, the hook-up portion 15 of the present embodiment includes the insulator 23 that has the face S1 steeply inclined and the faces S2 and S3 gently inclined. Therefore, the present embodiment makes it possible to provide the insulating layers 21 and the electrode layers 22 of the stacked films 15a and 15b on the faces S1, S2, and S3 that are inclined faces each having a suitable shape. For example, since the inclination of the face S1 is steep and the inclinations of the faces S2 and S3 are gentle, it is possible to suitably dispose the interconnects 66a to 66c and the transistors 17.

Second Embodiment

Figure 22:
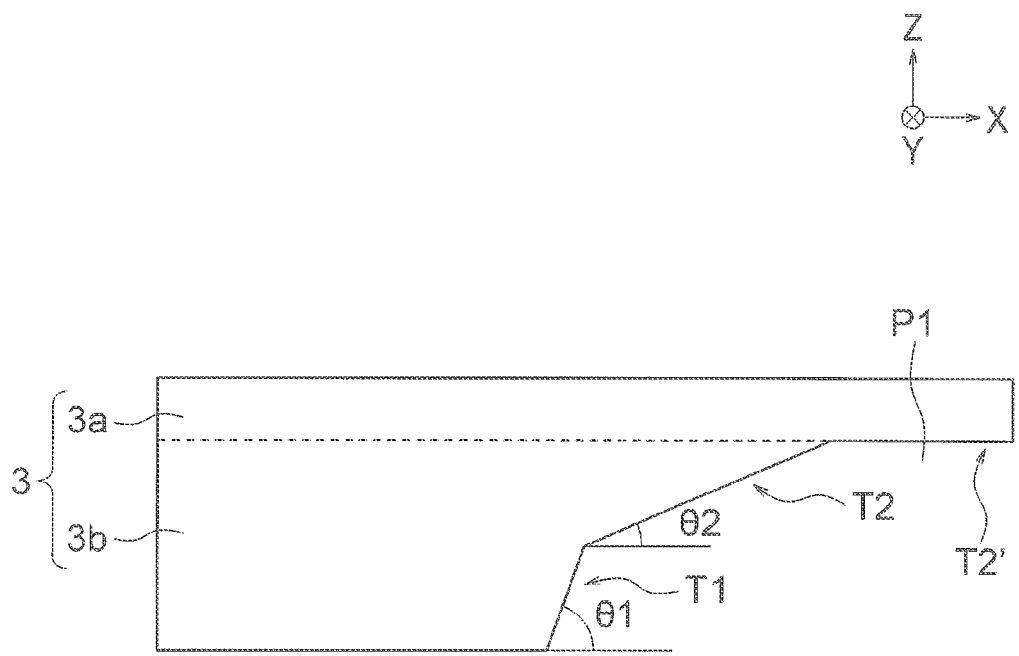
FIG. 22 is a cross-sectional view illustrating an example of a shape of a template 3 of a second embodiment.

FIG. 22 is a cross-sectional view illustrating an example of a shape of the template 3 of a second embodiment.

The template 3 in FIG. 22 is usable in the process of FIG. 18B, as with the template 3 described in the first embodiment. The template 3 in FIG. 22 includes the portion 3a and the portion 3b provided below the portion 3a, and includes the concave portion P1 in the portion 3b.

The concave portion P1 has the faces T1, T2, and T2' that have the areas and the inclinations same as the areas and the inclinations of the faces S1, S2, and S2' of each of the above-described insulators 23. In FIG. 22, the upper face and the lower face of the template 3 are parallel to the XY plane. The face T1 is inclined by an angle $\theta1$ to the upper face and the lower face of the template 3, and the face T2 is inclined by an angle $\theta2$ to the upper face and the lower face of the template 3. The angle $\theta2$ is less than the angle $\theta1$. In contrast, the face T2' is substantially parallel to the upper face and the lower face of the template 3, and an angle of the face T2' to the XY plane is substantially zero degrees. Each of the upper face and the lower face of the template 3 is an example of the predetermined face. Further, the faces T1, T2, and T2' are respectively examples of first, second, and third lower faces, and the angles $\theta1$ and $\theta2$ are respectively examples of the first and second angles.

FIGS. 23A to 25B are cross-sectional views illustrating a method of manufacturing the template 3 in FIG. 22.

Figure 23B:
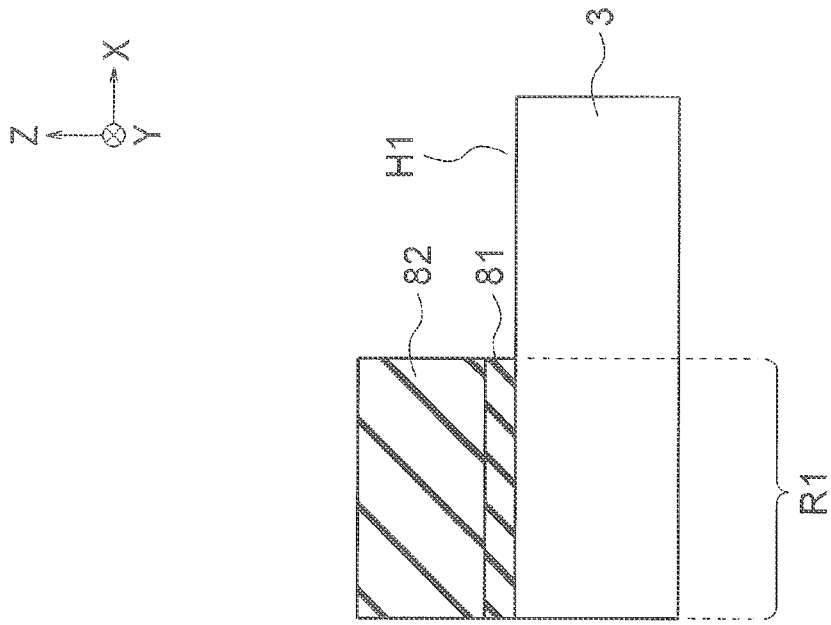
Figure 23A:
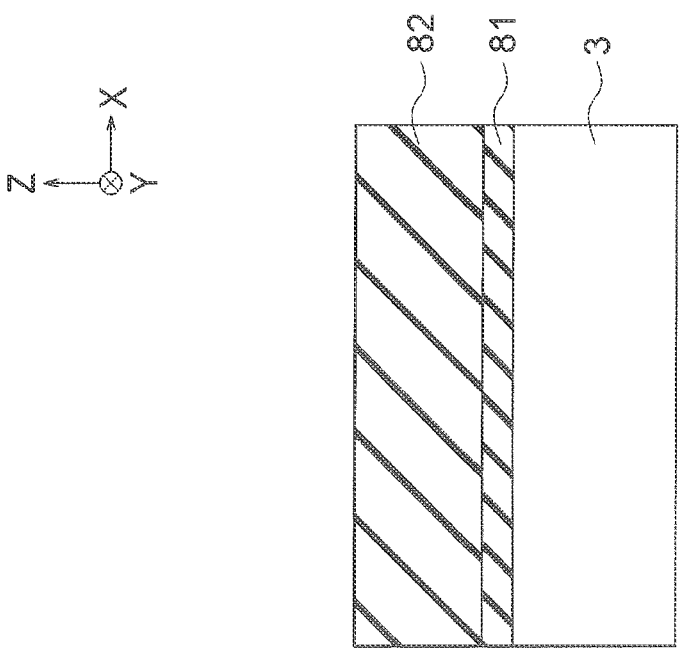

First, a substrate for the template 3 is prepared (FIG. 23A). In the present embodiment, the substrate is processed by etching to manufacture the template 3. In the following, the substrate is denoted as a "substrate 3". The substrate 3 is, for example, a transparent substrate such as a quartz substrate.

Next, after the substrate 3 is cleaned, a mask film 81 and a resist film 82 are formed in order on the substrate 3 (FIG. 23A). The mask film 81 is, for example, a hard mask film such as a silicon oxide film ($SiO_2$). The mask film 81 can be formed by an optional method that can uniformly form the mask film 81 on the substrate 3. The mask film 81 can be formed by, for example, sputtering, chemical vapor deposition (CVD), physical vapor deposition (PVD), atomic layer deposition (ALD), liquid phase deposition (LPD), or vapor deposition. The mask film 81 is an example of a first film. The resist film 82 is formed by, for example, being applied to the upper face of the mask film 81 by a coater.

Next, the resist film 82 is patterned by photolithography and etching, and the mask film 81 is processed by dry etching using the resist film 82 as a mask (FIG. 23B). As a result, an opening H1 is formed in the mask film 81, and the upper face of the substrate 3 is exposed in the opening H1. In contrast, the mask film 81 remains on a region R1 of the substrate 3. The region R1 is an example of a first region. The photolithography of the resist film 82 is performed by using, for example, an electron beam (EB) apparatus. The mask film 81 may be processed by wet etching in place of dry etching.

Figure 24B:
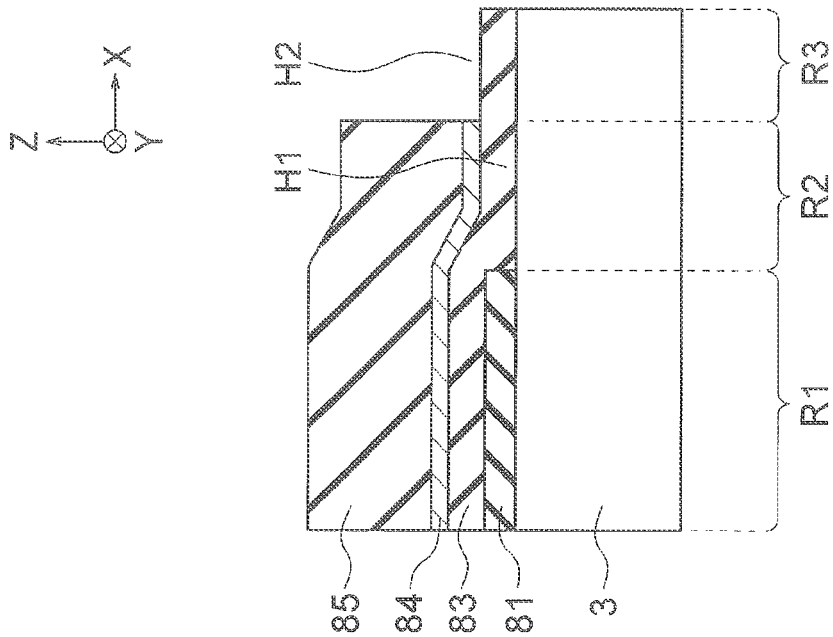
Figure 24A:
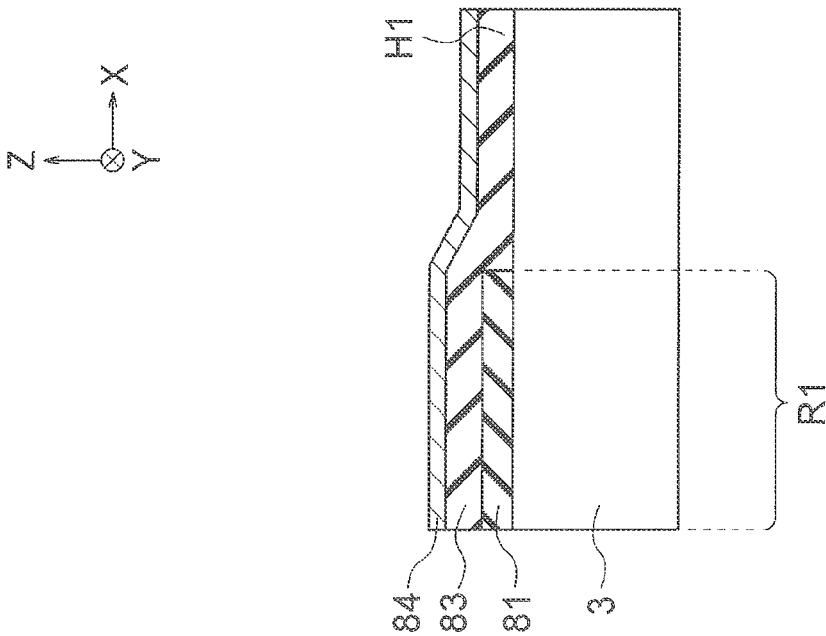

Next, after the resist film 82 is removed from the substrate 3, a mask film 83 and a mask film 84 are formed in order on the substrate 3 and the mask film 81 (FIG. 24A). The mask film 83 is, for example, a hard mask film such as a silicon oxide film doped with impurity atoms and a tetraethyl orthosilicate (TEOS) film. The mask film 84 is, for example, a hard mask film including a metal element or an organic compound. Examples of the metal element include chromium (Cr), molybdenum (Mo), tungsten (W), gold (Au), silver (Ag), and a platinum group element such as platinum (Pt). The mask film 84 of the present embodiment is a chromium film having a thickness of about 100 nm. A formation temperature of the mask film 84 is desirably lower than a formation temperature of the mask films 81 and 83 in order to prevent quality of the mask films 81 and 83 from being changed. The mask films 83 and 84 can be formed by, for example, sputtering, CVD, PVD, ALD, LPD, or vapor deposition. The mask films 83 and 84 are respectively examples of second and third films.

Next, a resist film 85 is formed on the mask film 84 (FIG. 24B). The resist film 85 is formed by, for example, being applied to an upper face of the mask film 84 by a coater.

Next, the resist film 85 is patterned by photolithography and etching, and the mask film 84 is processed by dry etching using the resist film 85 as a mask (FIG. 24B). As a result, an opening H2 is formed in the mask film 84, and the upper face of the mask film 83 is exposed in the opening H2. In contrast, the mask film 83 remains on regions R1, R2, and R3 of the substrate 3, and the mask film 84 remains on the regions R1 and R2 of the substrate 3. The regions R2 and R3 are respectively examples of second and third regions. The photolithography of the resist film 85 is performed by using, for example, an EB apparatus. The mask film 84 may be processed by wet etching in place of dry etching.

Next, after the mask film 83 in the opening H2 (on region R3) is removed, the substrate 3 is processed from the region R3 by wet etching using the mask films 81, 83, and 84 as masks (FIG. 25A). The wet etching is performed by using, for example, a chemical solution (etchant) including hydrogen fluoride (HF). The mask film 83 in the opening H2 may be removed by dry etching in the process of FIG. 24B, or may be removed by wet etching in the process of FIG. 25A when the above-described etching using the chemical solution is uniformly performed.

The wet etching in the process of FIG. 25A is performed by using, for example, a chemical solution that enables etching of the mask film 83 higher in etching rate than etching of the mask film 81 and etching of the substrate 3. In this case, the wet etching progresses such that the substrate 3 and the mask films 81 and 83 are processed in shapes illustrated in FIG. 25A, and further progresses such that the substrate 3 and the mask films 81 and 83 are processed in shapes illustrated in FIG. 25B. In FIG. 25A, the concave portion P1 having the faces T2 and T2' as the upper faces is formed in the regions R2 and R3 of the substrate 3. In FIG. 25B, heights of the faces T2 and T2' are lowered as compared with FIG. 25A, and the concave portion P1 having the faces T1, T2, and T2' as the upper faces is formed in the regions R1, R2, and R3 of the substrate 3. In other words, the concave portion P1 formed in the regions R2 and R3 in FIG. 25A expands to the region R1 in FIG. 25B.

The areas and the inclinations of the faces T1, T2, and T2' illustrated in FIGS. 25A and 25B are the same as the areas and the inclinations of the faces T1, T2, and T2' illustrated in FIG. 22. In FIGS. 25A and 25B, the upper face and the lower face of the substrate 3 are parallel to the XY plane. The face T1 is inclined by the angle θ1 to the upper face and the lower face of the substrate 3, and the face T2 is inclined by the angle θ2 to the upper face and the lower face of the substrate 3. The angle θ2 is less than the angle θ1. In contrast, the face T2' is substantially parallel to the upper face and the lower face of the substrate 3, and an angle of the face T2' to the XY plane is substantially zero degrees. Each of the upper face and the lower face of the substrate 3 is an example of the predetermined face. Further, the faces T1, T2, and T2' are respectively examples of first, second, and third upper faces, and the angles θ1 and θ2 are respectively examples of the first and second angles.

An infiltration amount of the chemical solution in a lateral direction in FIG. 25A can be controlled by the etching rate of the mask film 83. For example, in a case where the etching rate of the mask film 83 is 5 times the etching rate of the substrate 3, the angle θ2 becomes about 11 degrees. In a case where the etching rate of the mask film 83 is 10 times the etching rate of the substrate 3, the angle θ2 becomes about 5 degrees. In a case where the etching rate of the mask film 83 is 50 times the etching rate of the substrate 3, the angle θ2 becomes about 1 degree. The chemical solution of the present embodiment is, for example, 10% dilute HF solution, and the substrate 3 is processed such that a length of the face T2 in the X direction becomes 8 μm. Alternatively, the chemical solution of the present embodiment may be a mixed aqueous solution including 30% ammonium fluoride, 6% HF, and a surfactant, which can form the face T2 excellent in smoothness.

When the etching of the substrate 3 and the mask film 83 progresses, the mask film 81 is exposed in the concave portion P1 as illustrated in FIG. 25A. Thereafter, the etching rate of the mask film 81 determines the angle θ1 of the face T1. In FIG. 25B, the substrate 3 is processed such that a length of the face T1 in the X direction becomes 1 μm.

Thereafter, the mask films 81, 83, and 84 are removed from the substrate 3. The template 3 in FIG. 22 is manufactured from the substrate 3 in the above-described manner.

The method of the present embodiment is applicable to a case where the template 3 in which the angle θ2 is greater than the angle θ1 is manufactured. In addition, the method of the present embodiment is applicable not only to the case where the concave portion P1 having the two inclined faces (T1 and T2) is formed in the template 3 but also a case where a concave portion having three or more inclined faces is formed in the template 3.

Figure 26:
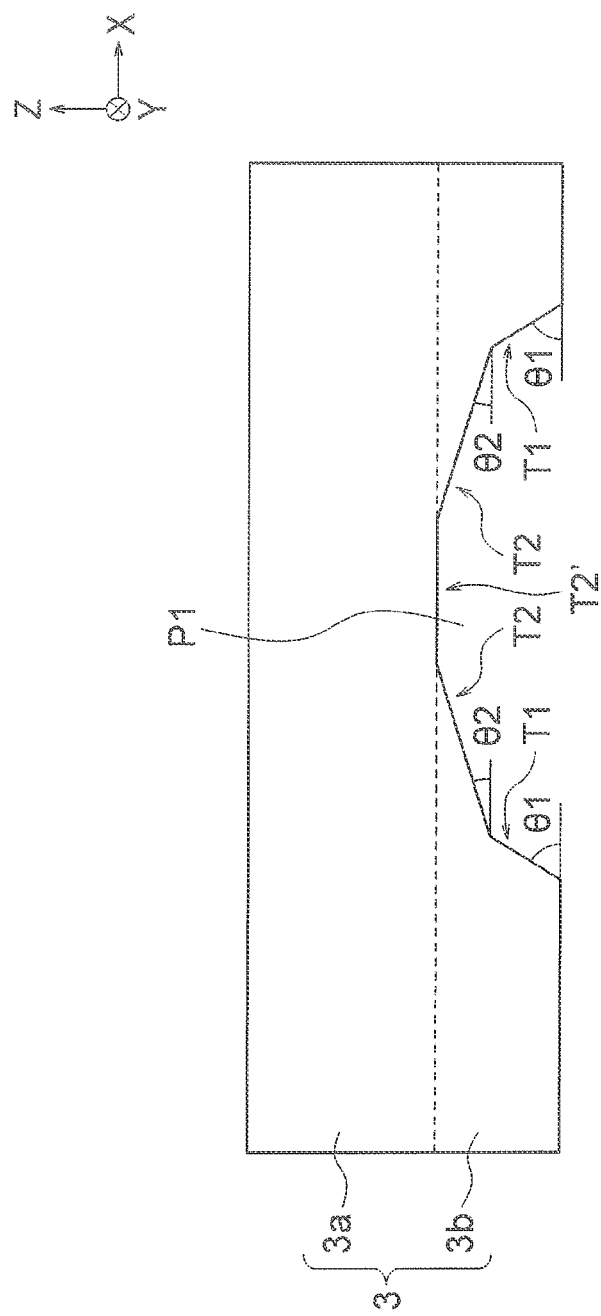
FIG. 26 is a cross-sectional view illustrating another example of the shape of the template 3 of the second embodiment.

FIG. 26 is a cross-sectional view illustrating another example of the shape of the template 3 of the second embodiment.

The template 3 in FIG. 26 is usable in the process of FIG. 18B as with the template 3 described in the first embodiment. The template 3 in FIG. 26 includes the portion 3a and the portion 3b provided below the portion 3a, and includes the concave portion P1 in the portion 3b.

The concave portion P1 has the faces T1, T2, and T2' that have the areas and the inclinations same as the areas and the inclinations of the faces S1, S2, and S2' of each of the above-described insulators 23. In FIG. 26, the upper face and the lower face of the template 3 are parallel to the XY plane. The face T1 is inclined by the angle θ1 to the upper face and the lower face of the template 3, and the face T2 is inclined by the angle θ2 to the upper face and the lower face of the template 3. The angle θ2 is less than the angle θ1. In contrast, the face T2' is substantially parallel to the upper face and the lower face of the template 3, and the angle of the face T2' to the XY plane is substantially zero degrees. Each of the upper face and the lower face of the template 3 is an example of the predetermined face. Further, the faces T1, T2, and T2' are respectively examples of the first, second, and third lower faces, and the angles θ1 and θ2 are respectively examples of the first and second angles.

FIGS. 27A to 29B are cross-sectional views illustrating a method of manufacturing the template 3 in FIG. 26. In descriptions of FIGS. 27A to 29B, descriptions of matters common to FIGS. 23A to 25B are omitted.

First, a substrate for the template 3 is prepared (FIG. 27A). In the following, the substrate is denoted as a "substrate 3".

Next, after the substrate 3 is cleaned, a mask film 83 and a resist film 86 are formed in order on the substrate 3 (FIG. 27A). The mask film 83 is, for example, a hard mask film such as a silicon oxide film doped with impurity atoms and a tetraethyl orthosilicate (TEOS) film. The mask film 83 is an example of the second film. The resist film 86 is formed by, for example, being applied to an upper face of the mask film 83 by a coater.

Next, the resist film 86 is patterned by photolithography and etching, and the mask film 83 is processed by dry etching using the resist film 86 as a mask (FIG. 27B). As a result, an opening H3 is formed in the mask film 83, and the upper face of the substrate 3 is exposed in the opening H3. The photolithography of the resist film 86 is performed by using, for example, an EB apparatus. The mask film 83 may be processed by wet etching in place of dry etching.

Figure 28B:
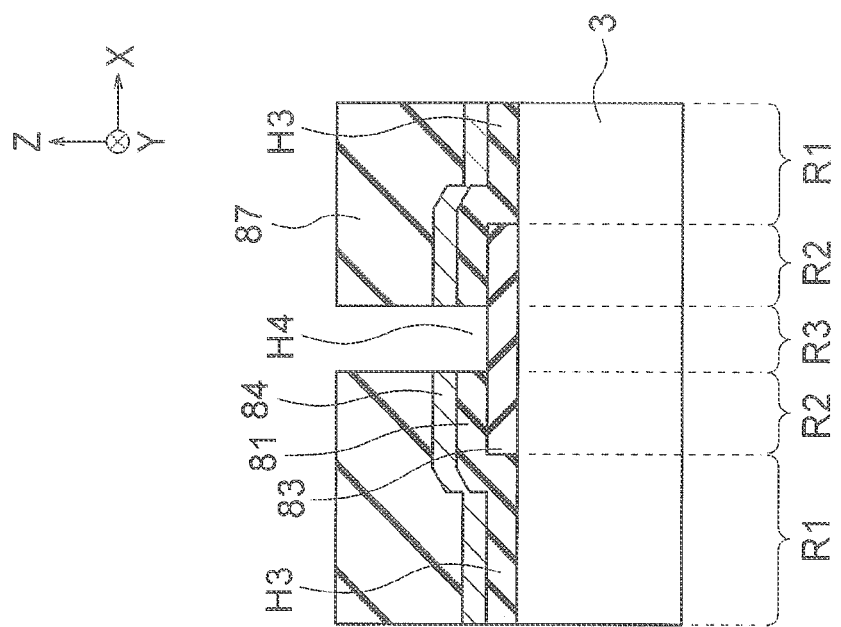
Figure 28A:
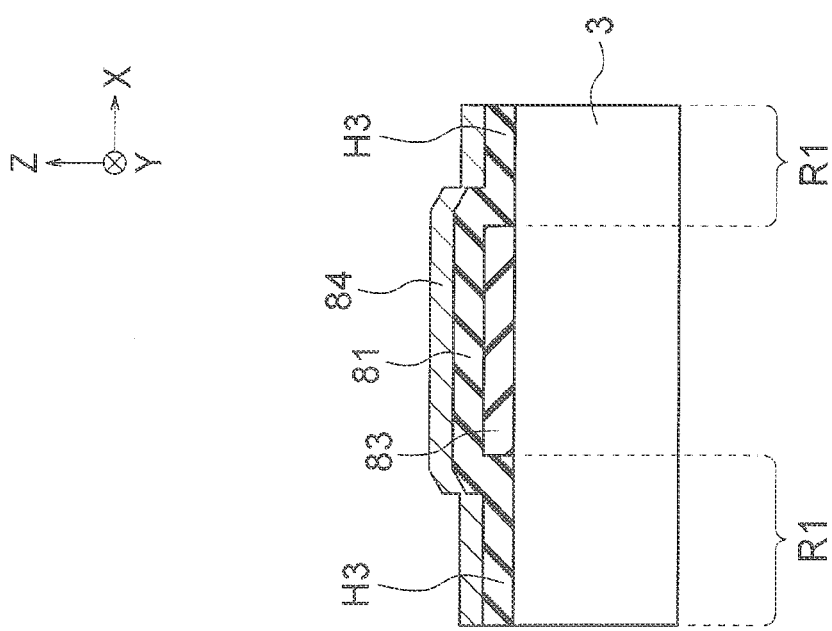

Next, after the resist film 86 is removed from the substrate 3, a mask film 81 and a mask film 84 are formed in order on the substrate 3 and the mask film 83 (FIG. 28A). The mask film 81 is, for example, a hard mask film such as a silicon oxide film. The mask film 84 is, for example, a hard mask film including a metal element or an organic compound. Examples of the metal element include chromium, molybdenum, tungsten, gold, silver, and a platinum group element such as platinum. The mask films 81 and 84 are respectively examples of the first and third films.

Next, a resist film 87 is formed on the mask film 84 (FIG. 28B). The resist film 87 is formed by, for example, being applied to an upper face of the mask film 84 by a coater.

Next, the resist film 87 is patterned by photolithography and etching, and the mask films 84 and 81 are processed by dry etching using the resist film 87 as a mask (FIG. 28B). As a result, an opening H4 is formed in the mask films 84 and 81, and the upper face of the mask film 83 is exposed in the opening H4. In contrast, the mask film 81 remains on regions R1 and R2 of the substrate 3, the mask film 83 remains on regions R2 and R3 of the substrate 3, and the mask film 84 remains on the regions R1 and R2 of the substrate 3. The regions R1, R2, and R3 are respectively examples of the first, second, and third regions. The photolithography of the resist film 87 is performed by using, for example, an EB apparatus. The mask films 84 and 81 may be processed by wet etching in place of dry etching.

Figure 29B:
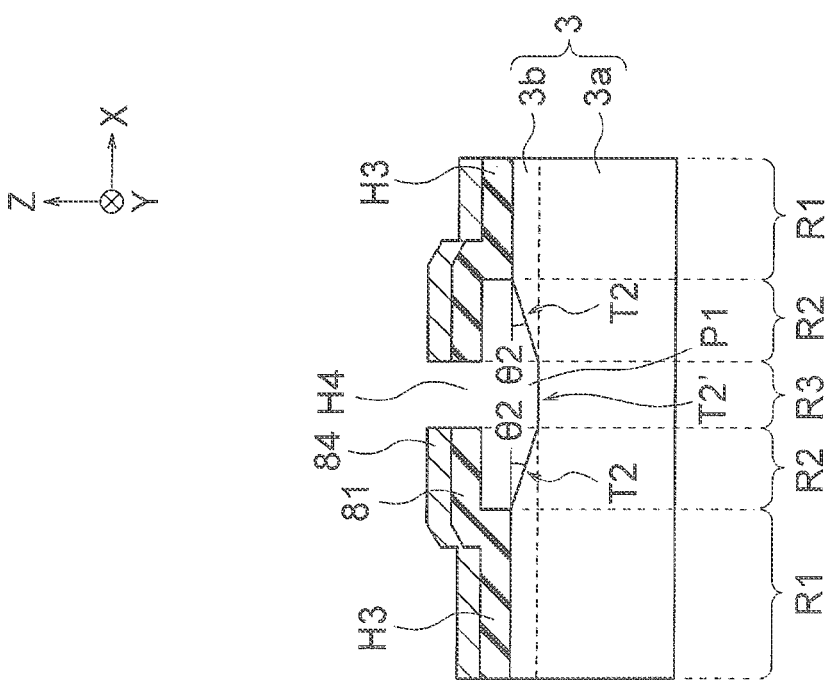
Figure 29A:
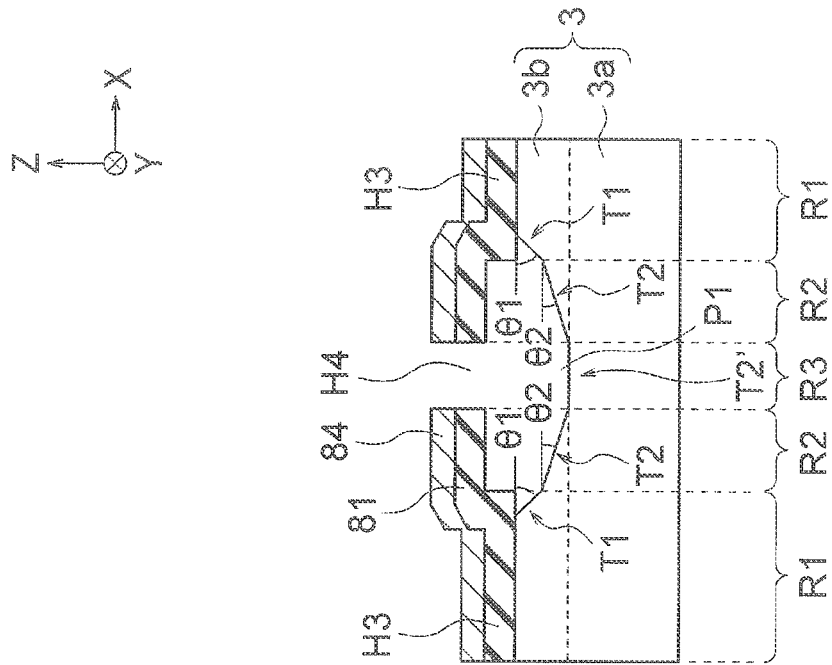

Next, after the mask film 83 in the opening H4 (on region R3) is removed, the substrate 3 is processed from the region R3 by wet etching using the mask films 81, 83, and 84 as masks (FIG. 29A). The wet etching is performed by using, for example, a chemical solution (etchant) including HF. The mask film 83 in the opening H4 may be removed by dry etching in the process of FIG. 28B, or may be removed by wet etching in the process of FIG. 29A when the above-described etching using the chemical solution is uniformly performed.

The wet etching in the process of FIG. 29A is performed by using, for example, a chemical solution that enables etching of the mask film 83 higher in etching rate than etching of the mask film 81 and etching of the substrate 3. In this case, the wet etching progresses such that the substrate 3 and the mask films 81 and 83 are processed in shapes illustrated in FIG. 29A, and further progresses such that the substrate 3 and the mask films 81 and 83 are processed in shapes illustrated in FIG. 29B. In FIG. 29A, the concave portion P1 having the faces T2 and T2' as the upper faces is formed in the regions R2 and R3 of the substrate 3. In FIG. 29B, heights of the faces T2 and T2' are lowered as compared with FIG. 29A, and the concave portion P1 having the faces T1, T2, and T2' as the upper faces is formed in the regions R1, R2, and R3 of the substrate 3. In other words, the concave portion P1 formed in the regions R2 and R3 in FIG. 29A expands to the region R1 in FIG. 29B.

The areas and the inclinations of the faces T1, T2, and T2' illustrated in FIGS. 29A and 29B are the same as the areas and the inclinations of the faces T1, T2, and T2' illustrated in FIG. 26. In FIGS. 29A and 29B, the upper face and the lower face of the substrate 3 are parallel to the XY plane. The face T1 is inclined by the angle θ1 to the upper face and the lower face of the substrate 3, and the face T2 is inclined by the angle θ2 to the upper face and the lower face of the substrate 3. The angle θ2 is less than the angle θ1. In contrast, the face T2' is substantially parallel to the upper face and the lower face of the substrate 3, and an angle of the face T2' to the XY plane is substantially zero degrees. Each of the upper face and the lower face of the substrate 3 is an example of the predetermined face. Further, the faces T1, T2, and T2' are respectively examples of the first, second, and third upper faces, and the angles θ1 and θ2 are respectively examples of the first and second angles.

An infiltration amount of the chemical solution in a lateral direction in FIG. 29A can be controlled by the etching rate of the mask film 83. When the etching of the substrate 3 and the mask film 83 progresses, an interface between the substrate and the mask film 81 is exposed in the concave portion P1 as illustrated in FIG. 29A. Thereafter, the etching rate of the mask film 81 determines the angle θ1 of the face T1.

Thereafter, the mask films 81, 83, and 84 are removed from the substrate 3. The template 3 in FIG. 26 is manufactured from the substrate 3 in the above-described manner.

Figure 30:
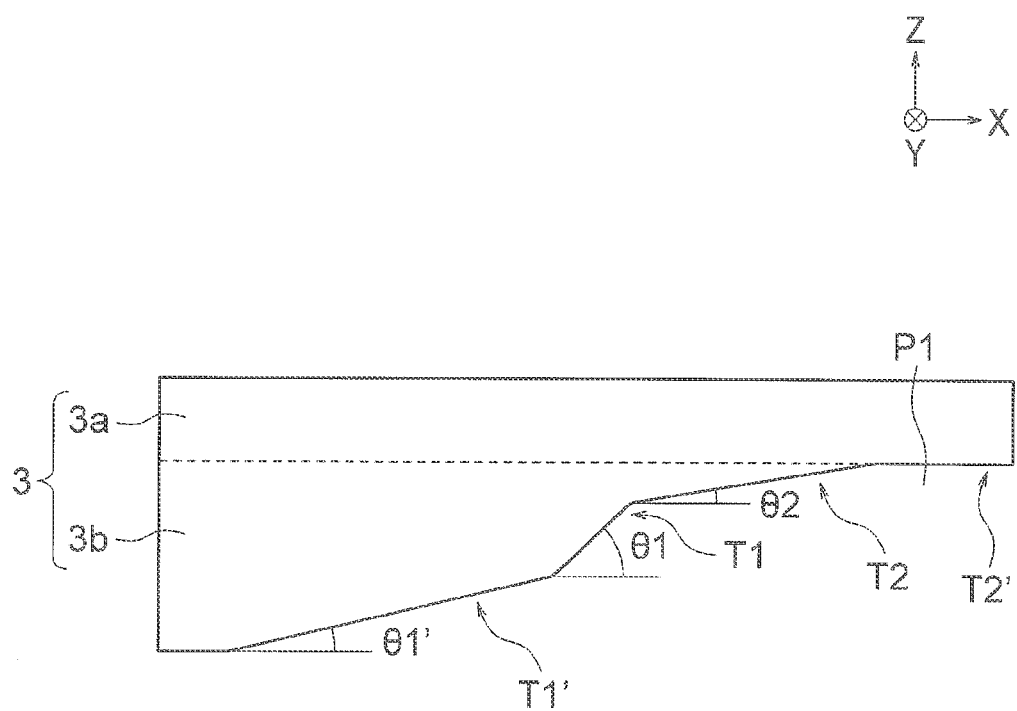
FIG. 30 is a cross-sectional view illustrating still another example of the shape of the template 3 of the second embodiment.

FIG. 30 is a cross-sectional view illustrating still another example of the shape of the template 3 of the second embodiment.

The shape of the template 3 in FIG. 30 is similar to the shape of the template 3 in FIG. 22, but the concave portion P1 in FIG. 30 has a face T1' in addition to the faces T1, T2, and T2'. The face T1' is provided at a position where an upper end of the face T1' is in contact with a lower end of the face T1. The face T1' is inclined by an angle θ1' to the upper face and the lower face of the template 3. The angle θ1' is less than the angle θ1. As described above, the concave portion P1 of the template 3 may include three or more inclined faces.

As described above, in the present embodiment, the template 3 is manufactured from the substrate 3 by processing the substrate 3 by using the mask films 81, 83, and 84 as the masks. Accordingly, the present embodiment makes it possible to manufacture the template 3 having the faces T1 and T2.

The embodiments described herein may be implemented in the following manner.

APPENDIX 1

A method of manufacturing a semiconductor device, comprising:
 forming first and second stacked films alternately including a plurality of insulating layers and a plurality of first layers on a substrate; and forming a plurality of columnar portions including charge storage layers and semiconductor layers in the insulating layers and the first layers of the first stacked film, wherein the second stacked film is formed by:
forming an insulator including a first upper face and a second upper face on the substrate, the first upper face being inclined by a first angle to an upper face of one of the first layers in the first stacked film, the second upper face being inclined by a second angle to the upper face of the one of the first layers in the first stacked film, the second angle being less than the first angle; and
alternately forming the insulating layers and the first layers of the second stacked film on the first and second upper faces of the insulator.

APPENDIX 2

The method of appendix 1, further comprising:
preparing a template including a first lower face and a second lower face, the first lower face being inclined by the first angle to a predetermined face, the second lower face being inclined by the second angle to the predetermined face; and
forming the insulator including the first and second upper faces on the substrate by pressing the template against a material of the insulator.

APPENDIX 3

The method of appendix 1, further comprising:
preparing a template including a first lower face and a second lower face, the first lower face being inclined by the first angle to a predetermined face, the second lower face being inclined by the second angle to the predetermined face; and
forming the insulator including the first and second upper faces on the substrate by discharging a material of the insulator into a space surrounded by an upper face of the substrate and the first and second lower faces of the template.

While certain embodiments have been described, these embodiments have been presented by way of example only, and are not intended to limit the scope of the inventions. Indeed, the novel devices, templates and methods described herein may be embodied in a variety of other forms; furthermore, various omissions, substitutions and changes in the form of the devices, templates and methods described herein may be made without departing from the spirit of the inventions. The accompanying claims and their equivalents are intended to cover such forms or modifications as would fall within the scope and spirit of the inventions.

The invention claimed is:
1. A semiconductor device comprising:
a substrate;
a first stacked film including a plurality of insulating layers and a plurality of electrode layers alternately provided on the substrate;
a second stacked film including the plurality of insulating layers and the plurality of electrode layers alternately provided on the substrate; and
a plurality of columnar portions provided in the insulating layers and the electrode layers of the first stacked film, and including charge storage layers and semiconductor layers,
wherein
the second stacked film further includes an insulator including a first lower face and a second lower face, the first lower face being inclined by a first angle to an upper face of one of the electrode layers in the first stacked film, the second lower face being inclined by a second angle to the upper face of the one of the electrode layers in the first stacked film, the second angle being less than the first angle, and
the insulating layers and the electrode layers in the second stacked film are provided below the first and second lower faces of the insulator.

2. The device of claim 1, further comprising:
a plurality of first interconnects provided below the first stacked film, and electrically connected to the columnar portions; and
a plurality of first transistors provided on the substrate,
wherein the first interconnects are electrically connected to the first transistors provided below the first stacked film.

3. The device of claim 1, further comprising:
a plurality of second interconnects provided below the second stacked film, and electrically connected to the electrode layers; and
a plurality of second transistors provided on the substrate,
wherein
the second interconnects provided below the first lower face are electrically connected to the second transistors provided below the first stacked film, and
the second interconnects provided below the second lower face are electrically connected to the second transistors provided below the second stacked film.

4. The device of claim 1, further comprising:
a plurality of first interconnects provided below the first stacked film, and electrically connected to the columnar portions;
a plurality of first transistors provided on the substrate;
a plurality of second interconnects provided below the second stacked film, and electrically connected to the electrode layers; and
a plurality of second transistors provided on the substrate,
wherein
the first interconnects are electrically connected to the first transistors provided below the first stacked film,
the second interconnects provided below the first lower face are electrically connected to the second transistors provided below the first stacked film,
the second interconnects provided below the second lower face are electrically connected to the second transistors provided below the second stacked film, and gate lengths of the second transistors are longer than gate lengths of the first transistors.

5. The device of claim 3, wherein
the second stacked film includes a first portion and a second portion, the first portion including a portion of the insulating layers and a portion of the electrode layers, the second portion being provided on the first portion and including another portion of the insulating layers and another portion of the electrode layers, and
the device further comprises plugs provided in the first portion and electrically connecting the electrode layers in the second portion and the second interconnects.

6. The device of claim 5, wherein the electrode layers in the first portion are electrically connected to the second interconnects without through the plugs.

7. The device of claim 5, wherein
the insulator in the second portion includes the first lower face and the second lower face, and the insulator in the first portion includes the second lower face.

8. The device of claim 5, wherein
the plugs provided below the first lower face are electrically connected to the second transistors provided below the first stacked film, and
the plugs provided below the second lower face are electrically connected to the second transistors provided below the second stacked film.

9. The device of claim 1, wherein the first angle is 4.5 degrees to 10 degrees.

10. The device of claim 1, wherein the second angle is 0.1 degrees to 4 degrees.

\* \* \* \* \*